United States Patent
Tsai et al.

(10) Patent No.: US 9,515,072 B2
(45) Date of Patent: Dec. 6, 2016

(54) FINFET STRUCTURE AND METHOD FOR MANUFACTURING THEREOF

(71) Applicant: TAIWAN SEMICONDUCTOR MANUFACTURING COMPANY LTD., Hsinchu (TW)

(72) Inventors: Chun Hsiung Tsai, Hsinchu (TW); Chun-Lung Ni, Hsinchu (TW); Kei-Wei Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/583,449

(22) Filed: Dec. 26, 2014

(65) Prior Publication Data

US 2016/0190137 A1 Jun. 30, 2016

(51) Int. Cl.
| | |
|---|---|
| H01L 21/70 | (2006.01) |
| H01L 27/092 | (2006.01) |
| H01L 29/66 | (2006.01) |
| H01L 29/78 | (2006.01) |
| H01L 29/10 | (2006.01) |
| H01L 21/225 | (2006.01) |
| H01L 21/02 | (2006.01) |
| H01L 21/311 | (2006.01) |
| H01L 21/8238 | (2006.01) |
| H01L 21/324 | (2006.01) |

(52) U.S. Cl.
CPC ....... *H01L 27/0924* (2013.01); *H01L 21/0228* (2013.01); *H01L 21/2256* (2013.01); *H01L 21/31111* (2013.01); *H01L 21/324* (2013.01); *H01L 21/823807* (2013.01); *H01L 21/823821* (2013.01); *H01L 29/1037* (2013.01); *H01L 29/6653* (2013.01); *H01L 29/66553* (2013.01); *H01L 29/66803* (2013.01); *H01L 29/7834* (2013.01); *H01L 29/7851* (2013.01)

(58) Field of Classification Search
None
See application file for complete search history.

(56) References Cited

U.S. PATENT DOCUMENTS

| | | | | |
|---|---|---|---|---|
| 8,883,585 B1 * | 11/2014 | Fumitake | ............ | H01L 29/785 257/E21.4 |
| 2008/0237719 A1 * | 10/2008 | Doyle | ............... | H01L 29/66795 257/351 |
| 2013/0102137 A1 * | 4/2013 | Jeng | .................... | H01L 21/2255 438/548 |
| 2014/0167120 A1 * | 6/2014 | Chi | ..................... | H01L 27/0886 257/288 |

OTHER PUBLICATIONS

Office action dated Oct. 4, 2016 for the Taiwan counterpart application 104139099.
Search report dated Oct. 4, 2016 for the Taiwan counterpart application 104139099.

* cited by examiner

*Primary Examiner* — Reema Patel
(74) *Attorney, Agent, or Firm* — WPAT, P.C., Intellectual Property Attorneys; Anthony King

(57) ABSTRACT

Present disclosure provides a FinFET structure, including a plurality of fins, a gate, and a first dopant layer. The gate is disposed substantially orthogonal over the plurality of fins, covering a portion of a top surface and a portion of sidewalls of the plurality of fins. The first dopant layer covers the top surface and the sidewalls of a junction portion of a first fin, configured to provide dopants of a first conductive type to the junction portion of the first fin. The junction portion is adjacent to the gate.

20 Claims, 29 Drawing Sheets

FINFET STRUCTURE AND METHOD FOR MANUFACTURING THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. The fin transistor has a channel (referred to as a fin channel) associated with a top surface and opposite sidewalls. The fin channel has a total channel width defined by the top surface and the opposite sidewalls. Although existing FinFET devices and methods of fabricating FinFET devices have been generally adequate for their intended purposes, they have not been entirely satisfactory in all respects. For example, a variation of fin width and profile, especially at an end of the fin, raises challenges in a FinFET process development. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
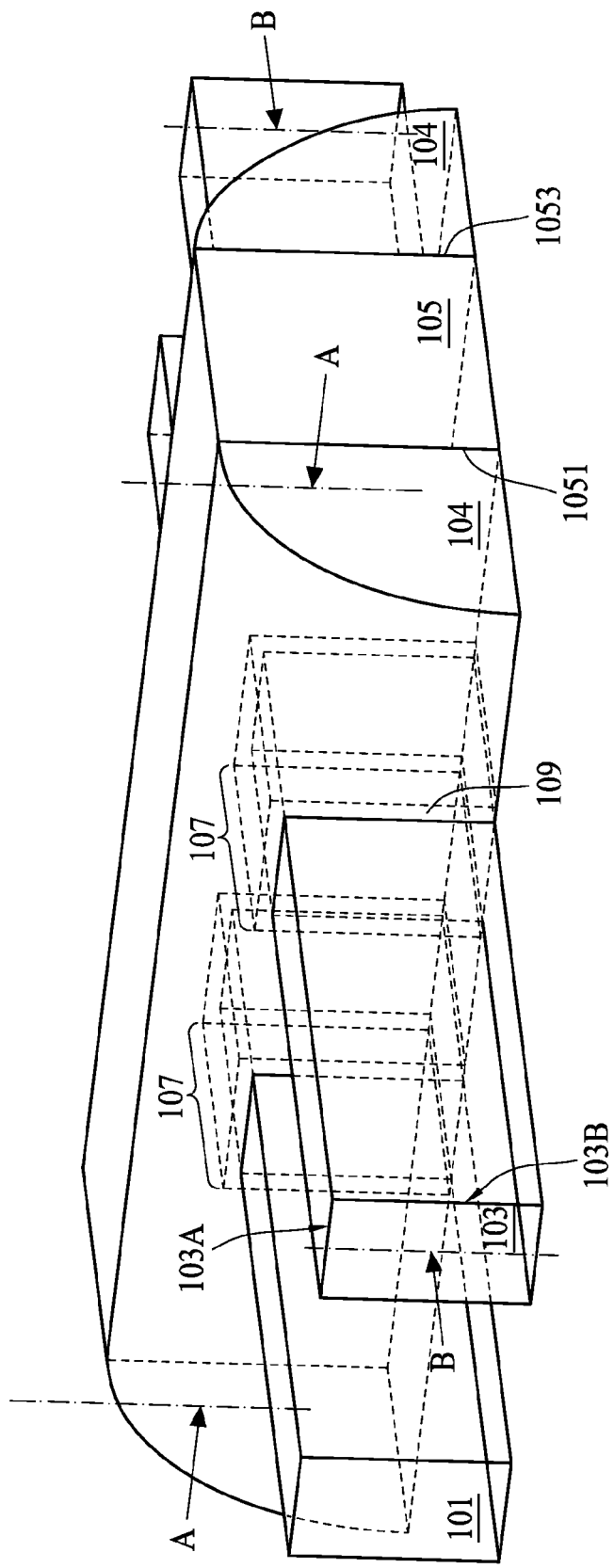
FIG. 1 shows a perspective view of a FinFET structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a semiconductor FinFET structure, a lightly-doped drain (LDD) region is formed in a vicinity of a boundary between a gate and a drain region or a source region. Implant dopants such as arsenic or phosphorous are utilized in lightly-doped drain (LDD) formation prior to recess formation on the fin. During an LDD implantation of an n-type fin, p-type fins adjacently disposed are covered by photoresist block in order to prevent the n-type dopant from bombarding the p-type fin. The LDD implant formed within the respective n-type fin is fundamentally limited by a height of said photoresist block, causing an implant shadowing effect wherein a first implant angle is constrained by the height of the photoresist block. In addition, a separation between two adjacent n-type fins, for example, a pitch of the n-type fin, determines a second implant angle shadowing certain regions of the n-type fin from being implanted. The first implant angle and the second implant angle can be approximately 10 degrees or less. As a result, a non-uniform LDD top to bottom dopant distribution caused by the implant shadowing effect can be observed. For example, a bottom of a respective fin LDD region receives approximately 30% or less dopant concentration than top fin LDD.

To be more specific, dopant concentration at a top surface, a first sidewall, and a second sidewall opposing the first sidewall of the fin with a desired dopant type (e.g. n-type) can be dramatically different. For example, the top surface of the fin may receive a highest amount of dopants while the bottom sidewall of the fin may receive a considerable lower dopant than the top counterpart. Moreover, a first sidewall may receive more dopants than the second sidewall opposite thereto because the environment in proximity to the first sidewall and the second sidewall are different. For instance, a photoresist block covering a fin of an opposite conductive type can be disposed immediately adjacent to the first sidewall, while an exposed fin can be disposed adjacent to the second sidewall. The shadowing effect with respect to the first and the second sidewall are thus different. Consequently, dopant concentration at the top surface, the first sidewall, and the second sidewall can be substantially different after the implantation. Even the annealing operation is followed in order to activate and redistribute the dopants, effect are limited to some extent.

Solutions such as increasing the implantation energy is proposed to solve the non-uniform distribution of the dopants in the LDD region of a fin. However, not only the vertical range of the dopant but also the lateral range of the dopant may be extended at the increase of the implantation energy. Because the LDD region is in proximity to a channel region, the lateral encroachment of the dopant can substantially create scattering centers in the channel region, and hence deteriorate the performance of the transistor device. The uniformity of the dopant concentration at the top surface, the first sidewall, and the second sidewall of a fin is crucial for $I_{on}$ performance of the device. It is understood that current density are concentration at the surface of a channel region where the fin is in contact with the wrapped gate. Fin surface at the LDD region lacking sufficient dopants forms bottlenecks for the current to flow through the channel. Therefore, forming the LDD region on a fin with uniform dopant distribution at the top surface, the first sidewall, and the second sidewall opposite to the first sidewall is critical to improve device performance.

Present disclosure provides a FinFET structure that is able to form uniform dopant distribution along the top surface, the first sidewall, and the second sidewall of the fin at an LDD region.

Present disclosure also provides a method for forming a FinFET structure that is able to form uniform dopant distribution along the top surface, the first sidewall, and the second sidewall of the fin at an LDD region.

Referring to FIG. 1, FIG. 1 is a perspective view of a FinFET structure 10. The FinFET structure 10 only shows the portion above an insulating layer, for example, shallow trench isolation (STI). In some embodiments, semiconductor fins 101 and 103 are n-type fins, the bottom of which extends into the insulating layer (not shown in FIG. 1). The FinFET structure 10 further includes a gate 105 disposed substantially orthogonal over the fins 101 and 103. However, the orthogonality between the fins and the gate is not a requirement to carry out the FinFET structure described herein. Other arrangements such as oblique or staggered are within the contemplated scope of the present disclosure. The fins 101 and 103 penetrate through the sidewalls 1051 and 1053 of the gate 105 along a longitudinal direction of the fin. The gate 105 thus covers a portion of a top surface and a portion of sidewalls of the fins 103 and 105. For clarity purpose, the portion of the fins covered by the gate 105 is not shown in FIG. 1. In some embodiments, the portion of the fins covered by the gate 105 is called the channel portion of the fin 103.

Still referring to FIG. 1, a junction portion 107 of the fins 103 and 105 can be identified as a region of the fin in proximity to the gate 105. In some embodiments, the junction portion 107 can be an LDD region or a Halo region of the fin. Referring to fin 103, a first dopant layer 109 is covered on a top surface 103A and sidewalls 103B of the fin 103. The first dopant layer 109 may include n-type dopant such as phosphorous and in configured to provide the n-type dopant to the region of the fin covered by said first dopant layer 109. In some embodiments, the first dopant layer 109 may include phosphosilicate glass (PSG) or phosphor-doped oxides. The junction region 107 in FIG. 1 is adjacent to the sidewall 1051 of the gate 105. On the opposite side of the gate 105, another first dopant layer (not shown) is also formed adjacent to the sidewall 1053 of the gate 105, covering the top surface 103A and the sidewalls 103B of the fin 103.

Still referring to FIG. 1, a sidewall spacer 104 is disposed at both sidewalls 1051, 1053 of the gate 105. For the purpose of clarity, the sidewall spacer 104 is depicted in a perspective view, such that the junction region 107 and the first dopant layer 109 covered under the spacer 104 can be viewed. In other embodiments, the first dopant layer 109 may not be completely covered under the spacer 104.

Figure 2:
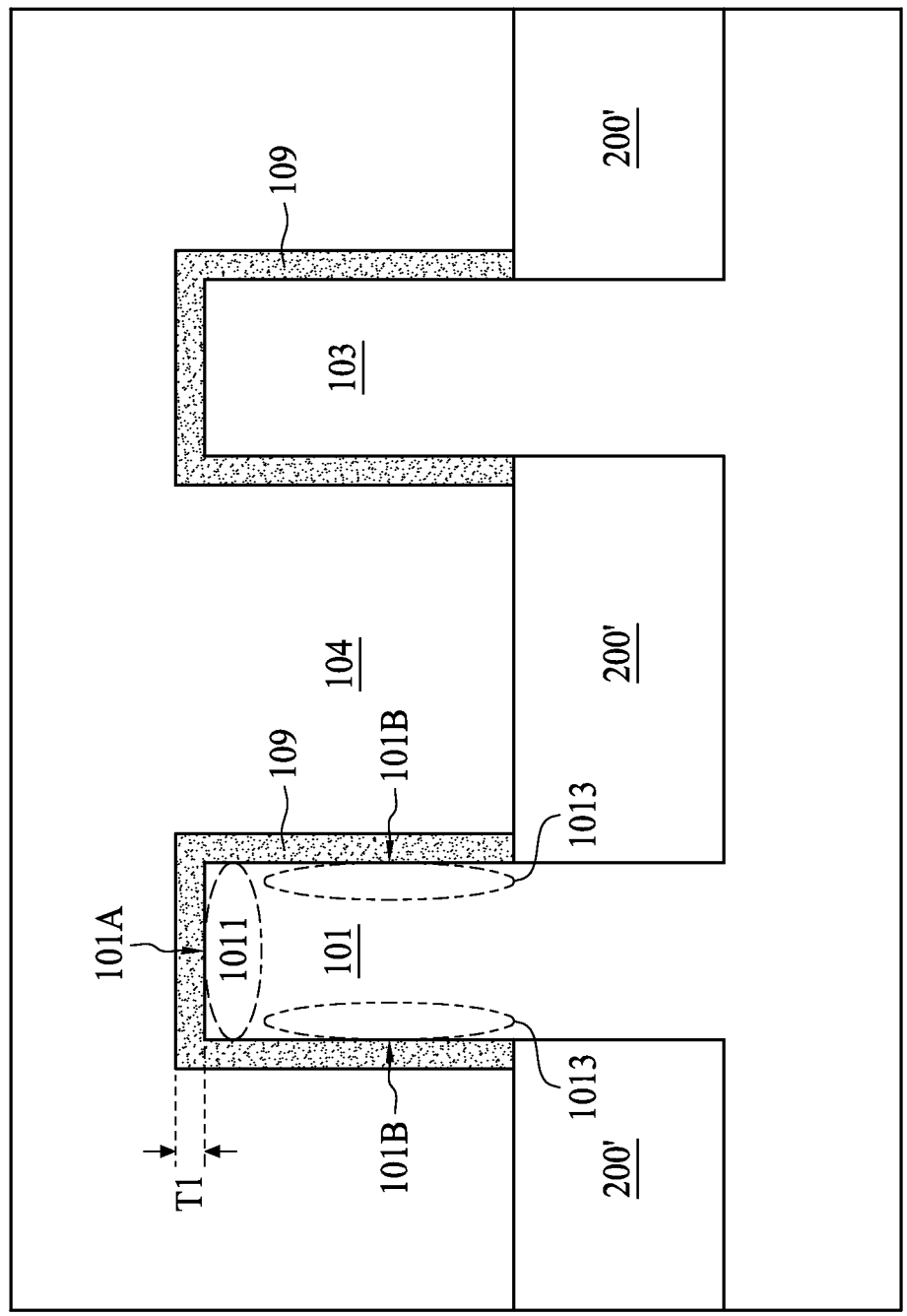
FIG. 2 shows a cross sectional view along line AA of the FinFET structure shown in FIG. 1, in accordance with some embodiments of the present disclosure.

Referring to FIG. 2, FIG. 2 is a cross sectional view along line AA of the FinFET structure shown in FIG. 1. In FIG. 1, a cross section dissected along line AA exposes the junction portion 107 of the fin 103, the first dopant layer 109, and the sidewall spacer 104 surrounding thereof. FIG. 2 further shows a portion below a surface of the insulating layer 200' such as an STI. As shown in FIG. 2, the fins 101 and 103 include a portion extruding from the insulating layer 200' and a portion surrounded by the insulating layer 200'. Only the portion extruding from the insulating layer 200' is covered by the first dopant layer 109. In some embodiments, the portion of the fin 101 extruding from the insulating layer 200' has a height of from about 30 nm to about 50 nm. The portion of the fin 101 surrounded by the insulating layer 200 has a height of from about 60 nm to about 80 nm. The first dopant layer 109 covering the top surface 101A and the sidewalls 101B of the fin 101 can have a thickness T1 in a range of from about 2 nm to about 8 nm. A FinFET structure having a first dopant layer arranged as shown in FIG. 2 demonstrates a uniform dopant distribution at region approximate to the top surface 101A and to the sidewalls 101B of the fin 101. For example, dopant concentrations at the top region 1011 and the sidewall region 1013 are substantially identical. Alternatively stated, a dopant concentration difference between the top region 1011 and the sidewall region 1013 is below about 5%.

In some embodiments, a two-dimensional dopant concentration mapping can be measured by Scanning Spreading Resistance Microscopy (SSRM). SSRM provides a wide range resistance mapping and high spatial resolution carrier density profiling. By using SSRM as a means for measurement, dopant concentration distribution in the fins 101 and 103 can be mapped and the dopant concentration at the top region 1011 and the sidewall region 1013 can be compared.

Figure 3:
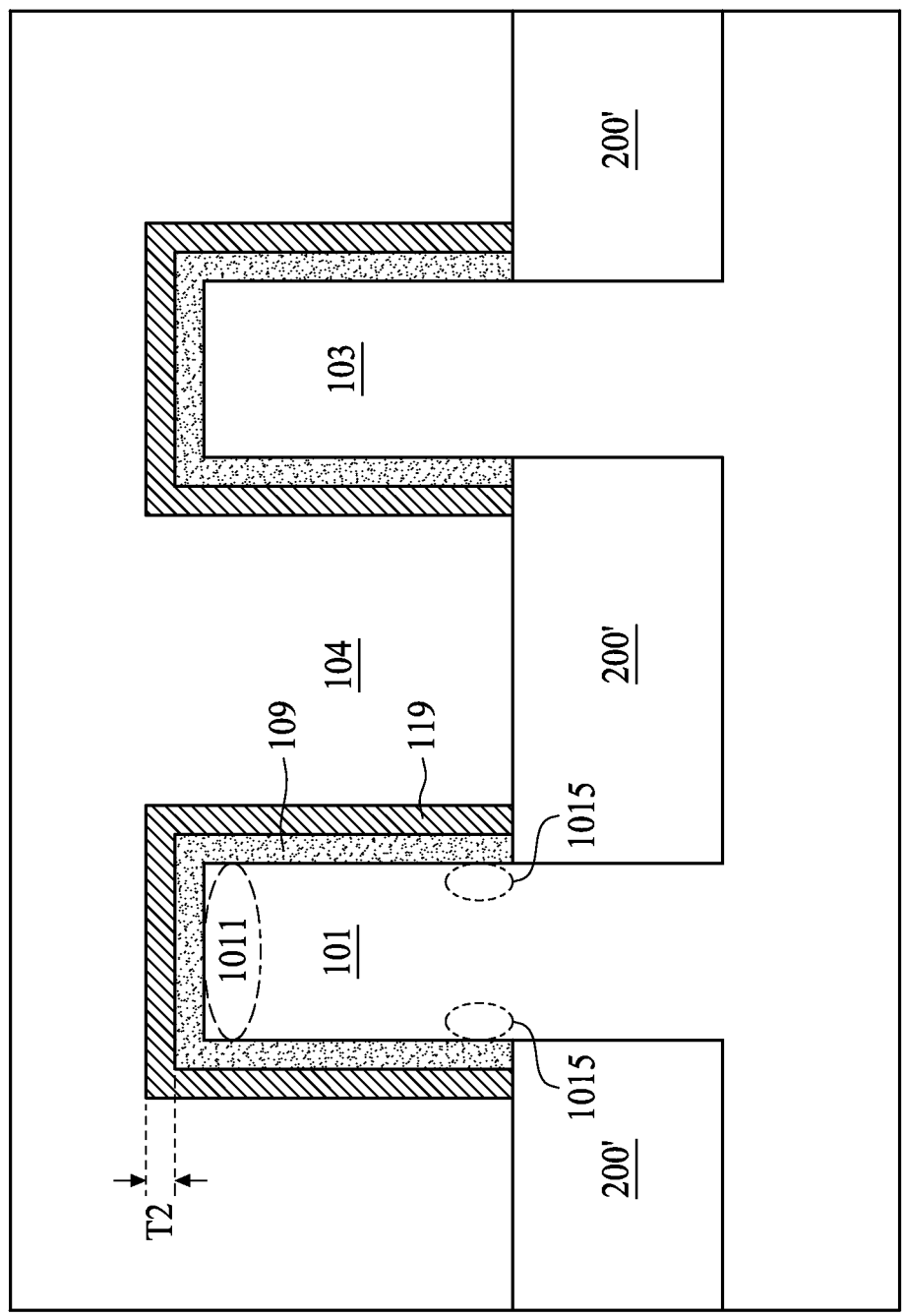
FIG. 3 shows a cross sectional view along line AA of the FinFET structure shown in FIG. 1, in accordance with some embodiments of the present disclosure.

Referring to FIG. 3, FIG. 3 is a cross sectional view along line AA of the FinFET structure shown in FIG. 1. In addition to a first dopant layer 109, a capping layer 129 is further disposed thereover. In some embodiments, the thickness T2 of the capping layer 129 is in a range of from about 5 nm to about 10 nm. In some embodiments, the capping layer 129 and the sidewall spacer 104 can be made of the same materials such as SiN or they can be made of different materials, so that the capping layer 129 is distinguishable from the sidewall spacer 104. Compared to a conventional FinFET structure where no first dopant layer 109 is disposed over the junction region 107 of the fin 103, dopant concentration at the top region 1011 and the sidewall bottom region 1015 of the present disclosure are substantially identical, even before an annealing operation. In a case where no dopant layer is applied, a reduced amount of implant reaches sidewall bottom 1015 due to implant shadowing effect, and hence the dopant concentration between the top region 1011 and the sidewall bottom region 1015 differs substantially even after a post-implant anneal.

Figure 4:
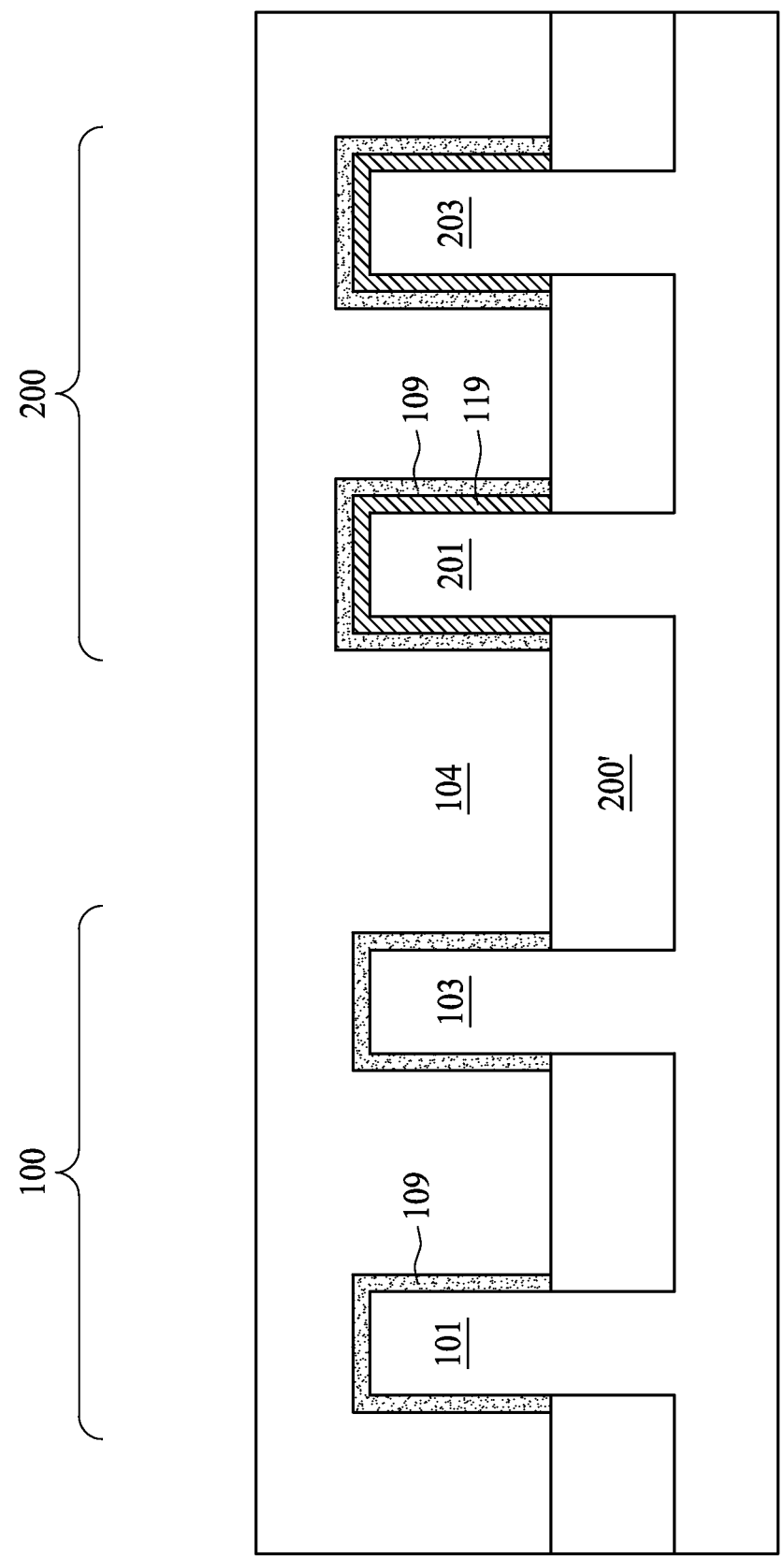
FIG. 4 shows a cross sectional view of a junction portion of a FinFET structure, in accordance with some embodiments of the present disclosure.

Referring to FIG. 4, FIG. 4 shows a cross sectional view of a junction portion of a FinFET structure, in accordance with some embodiments of the present disclosure. The junction portions of four fins are shown in the cross section of FIG. 4. Fins 101 and 103 are referred to the "first fin" 100 or the "first set of fins". Fins 201 and 203 are referred to the "second fin" 200 or the "second set of fins". In some embodiments, the first fin 100 and the second fin 200 are different in the conductive type. For example, first fin 100 is an n-type fin while the second fin 200 is a p-type fin. As shown in FIG. 4, a first dopant layer 109 is formed directly in contact with the first fin 100, whereas a diffusion barrier 119 is formed directly in contact with the second fin 200, separating the second fin 200 and the first dopant layer 109. Alternatively stated, a single layer is formed over the first fin 100, and a bi-layer is formed over the second fin 200. In some embodiments, the bi-layer includes a first dopant layer 109 and a diffusion barrier 119. A thickness of the first dopant layer 109 is in a range of from about 1 nm to about 8 nm. The diffusion barrier 119 shall be thick enough to prevent the n-type dopants in the first dopant layer 109 from being diffused into the second fin 200. In some embodiments, a thickness of the diffusion barrier 119 is between about 5 nm to about 10 nm.

Figure 5:
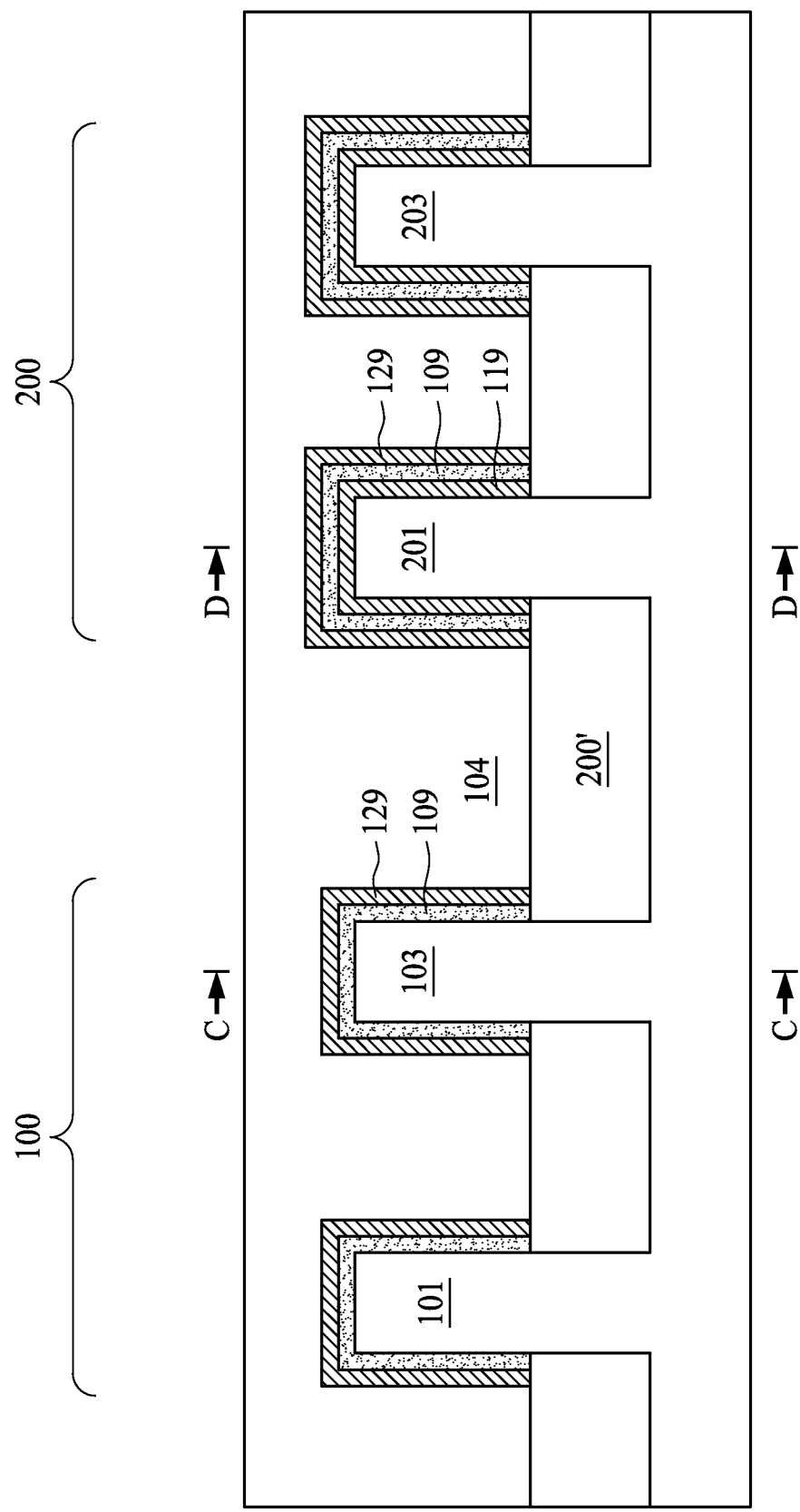
FIG. 5 shows a cross sectional view of a junction portion of a FinFET structure, in accordance with some embodiments of the present disclosure.

Referring to FIG. 5, FIG. 5 shows a cross sectional view of a junction portion of a FinFET structure, in accordance with some embodiments of the present disclosure. A difference between FIG. 4 and FIG. 5 is that a capping layer 129 is further disposed over the first dopant layer 109 of the first fin 100 and the first dopant layer 109 of the second fin 200. In some embodiments, the capping layer 129 and the diffusion barrier 119 are made of identical material. In other embodiments, the capping layer 129 and the diffusion barrier 119 are not made of identical material. In some embodiments, the thickness of the capping layer 129 and that of the diffusion barrier 119 are substantially identical. The capping layer 129 shown in FIG. 5 is to provide a stable seal to the first dopant layer 109 under high-temperature annealing operation as is discussed later in the present disclosure.

Figure 6:
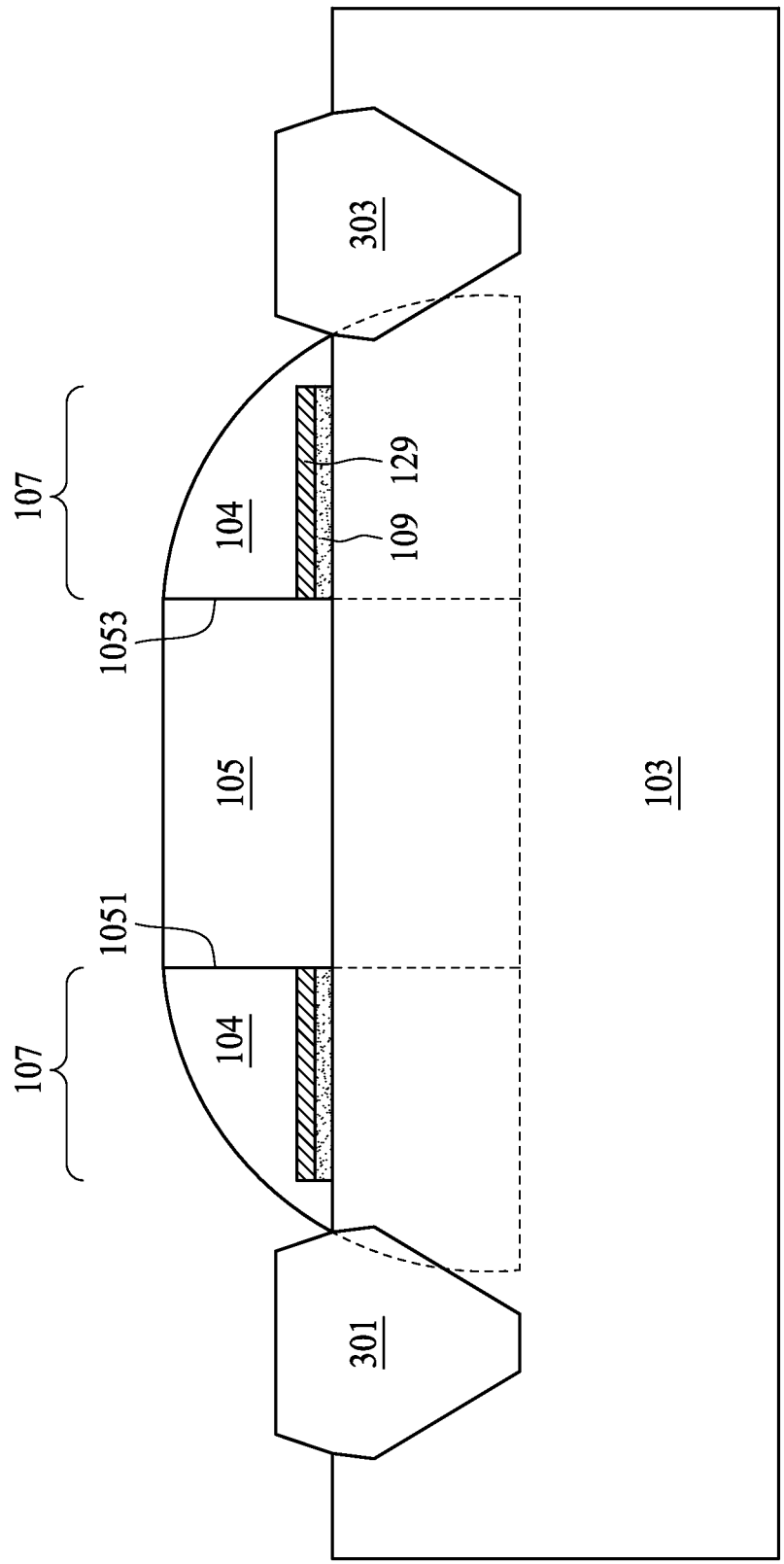
FIG. 6 shows a cross sectional view of a FinFET structure along line BB as shown in FIG. 1 and line CC as shown in FIG. 5, in accordance with some embodiments of the present disclosure.

Referring to FIG. 6, FIG. 6 shows a cross sectional view of a FinFET structure along line BB of FIG. 1 and along line CC of FIG. 5, in accordance with some embodiments of the present disclosure. The gate 105 and the sidewall spacer 104 are positioned on over the first fin 103. Dotted lines shown in FIG. 6 refer to the hidden contour of the gate 105 and sidewall spacer 104 across the first fin 103. The first dopant layer 109 and the capping layer 129 are disposed over the first fin 103, abutting sidewalls 1051 and 1053 of the gate 105. As shown in FIG. 6, a regrown source 301 and regrown drain 303 are formed partially in the first fin 103. In some embodiments, a widest portion of the regrown region is encroached under the sidewall spacer 104. In other embodiments, the widest portion of the regrown region is in contact with the tri-layer formed over the lightly doped region or LDD at the junction portion 107 of the first fin 103.

Figure 7:
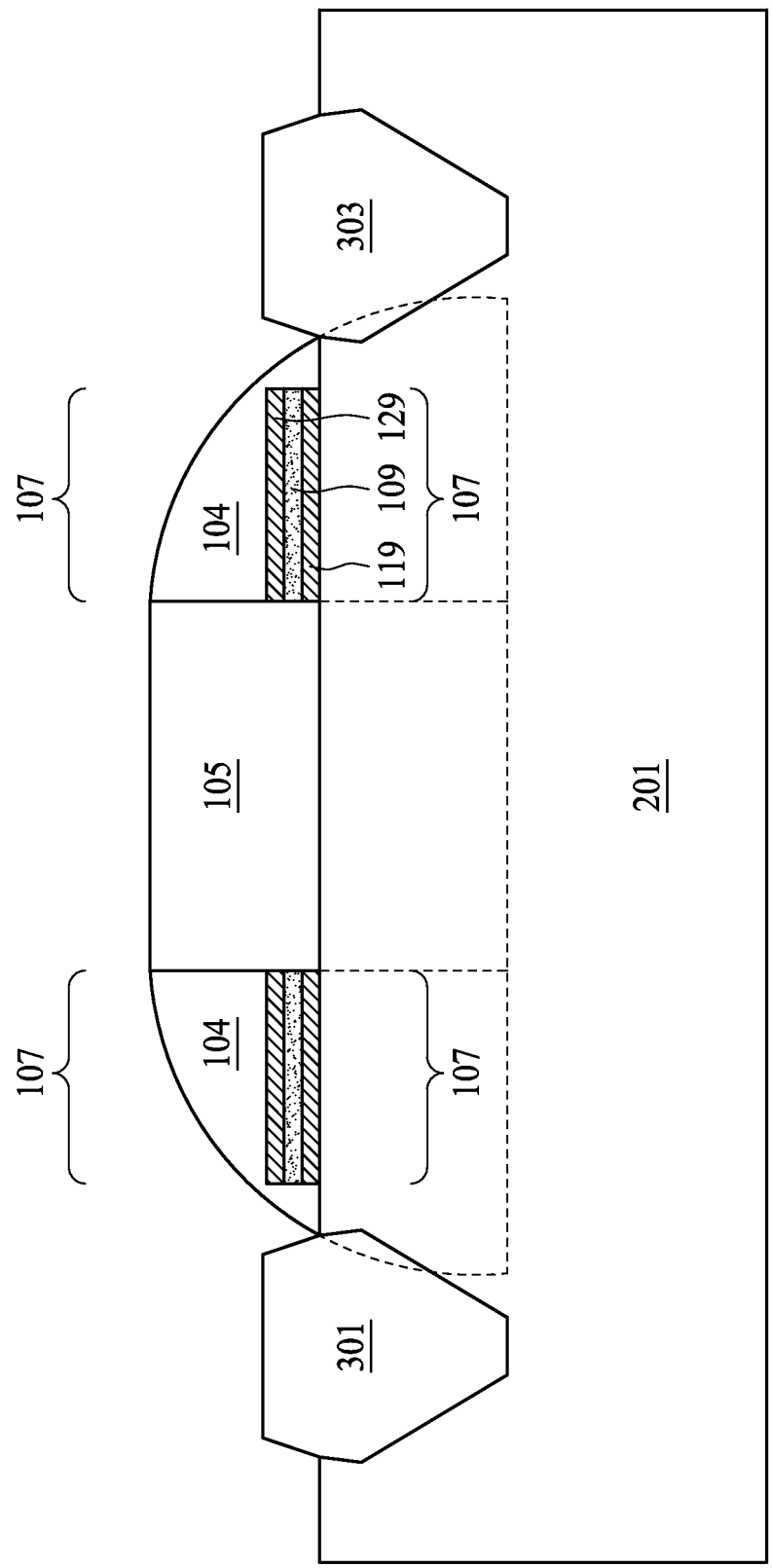
FIG. 7 shows a cross sectional view of a FinFET structure along line BB as shown in FIG. 1 and line DD as shown in FIG. 5, in accordance with some embodiments of the present disclosure.

Referring to FIG. 7, FIG. 7 shows a cross sectional view of a FinFET structure along line BB of FIG. 1 and along line DD of FIG. 5, in accordance with some embodiments of the present disclosure. The gate 105 and the sidewall spacer 104 are positioned on over the second fin 201. Dotted lines shown in FIG. 7 refer to the hidden contour of the gate 105 and sidewall spacer 104 across the second fin 201. The barrier layer 119, the first dopant layer 109, and the capping layer 129 are disposed over the second fin 201, abutting sidewalls 1051 and 1053 of the gate 105. As shown in FIG. 7, a regrown source 301 and regrown drain 303 are formed partially in the second fin 201. In some embodiments, a widest portion of the regrown region is encroached under the sidewall spacer 104. In other embodiments, the widest portion of the regrown region is in contact with the tri-layer formed over the lightly doped region or LDD at the junction portion 107 of the second fin 201.

Figure 8:
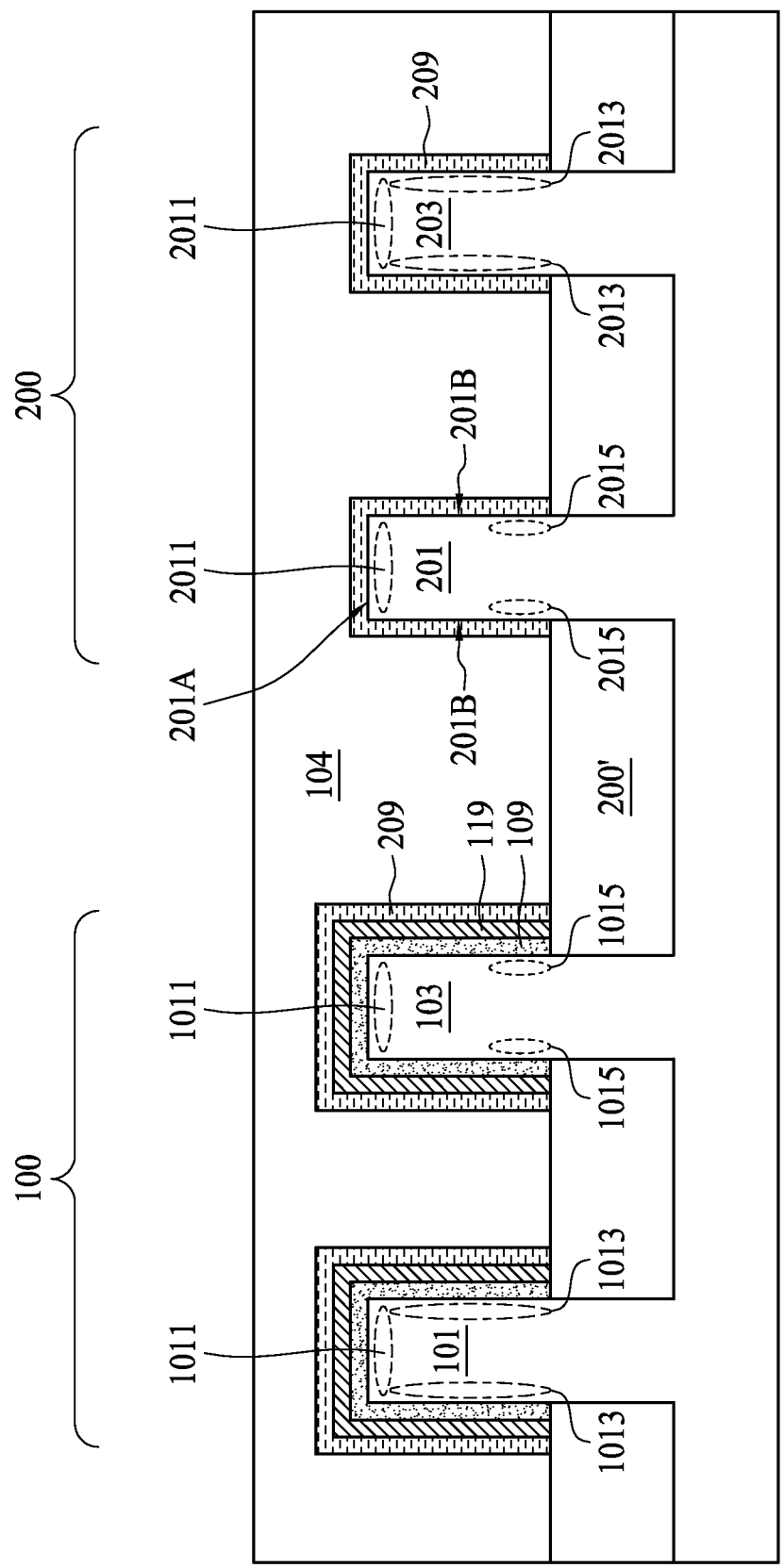
FIG. 8 shows a cross sectional view of a junction portion of a FinFET structure, in accordance with some embodiments of the present disclosure.

Referring to FIG. 8, FIG. 8 shows a cross sectional view of a junction portion of a FinFET structure, in accordance with some embodiments of the present disclosure. As shown in FIG. 8, a second dopant layer 209 is formed directly in contact with the second fin 200, whereas a first dopant layer 109 is formed directly in contact with the first fin 100. In some embodiments, the second dopant layer 209 includes dopants of an opposite type to that of the first dopant layer 109. For example, the second dopant layer 209 includes borosilicate glass (BSG) or boron-doped silicon oxides. The second dopant layer 209 covers a top surface 201A and sidewalls 201B of the second fin 200. The second dopant layer 209 directly contact the second fin 200 in order to allow the second dopants contained therein to diffuse into the second fin 200.

Still referring to FIG. 8, the capping layer 129 and a second dopant layer 209 are further sequentially disposed over the first dopant layer 109 over the first fin 100. Alternatively stated, a triple layer is formed over the first fin 100, and a single layer is formed over the second fin 200. A thickness of the second dopant layer 209 is in a range of from about 1 nm to about 8 nm, similar to the thickness of the first dopant layer 209. As shown in FIG. 8, according to a SSRM measurement, second dopant concentration at a top region 2011 and at a bottom sidewall 2015 of the second fin 200 are substantially the same. In other words, a difference between the second dopant concentration at a top region 2011 and at a sidewall 2013 of the second fin 200 is below about 5%. Similarly, the first dopant concentration at a top region 1011 and that at a bottom sidewall 1015 of the first fin 100 are substantially the same. In other words, a difference between the first dopant concentration at a top region 1011 and at a sidewall 1013 of the first fin 100 is below about 5%.

Figure 9:
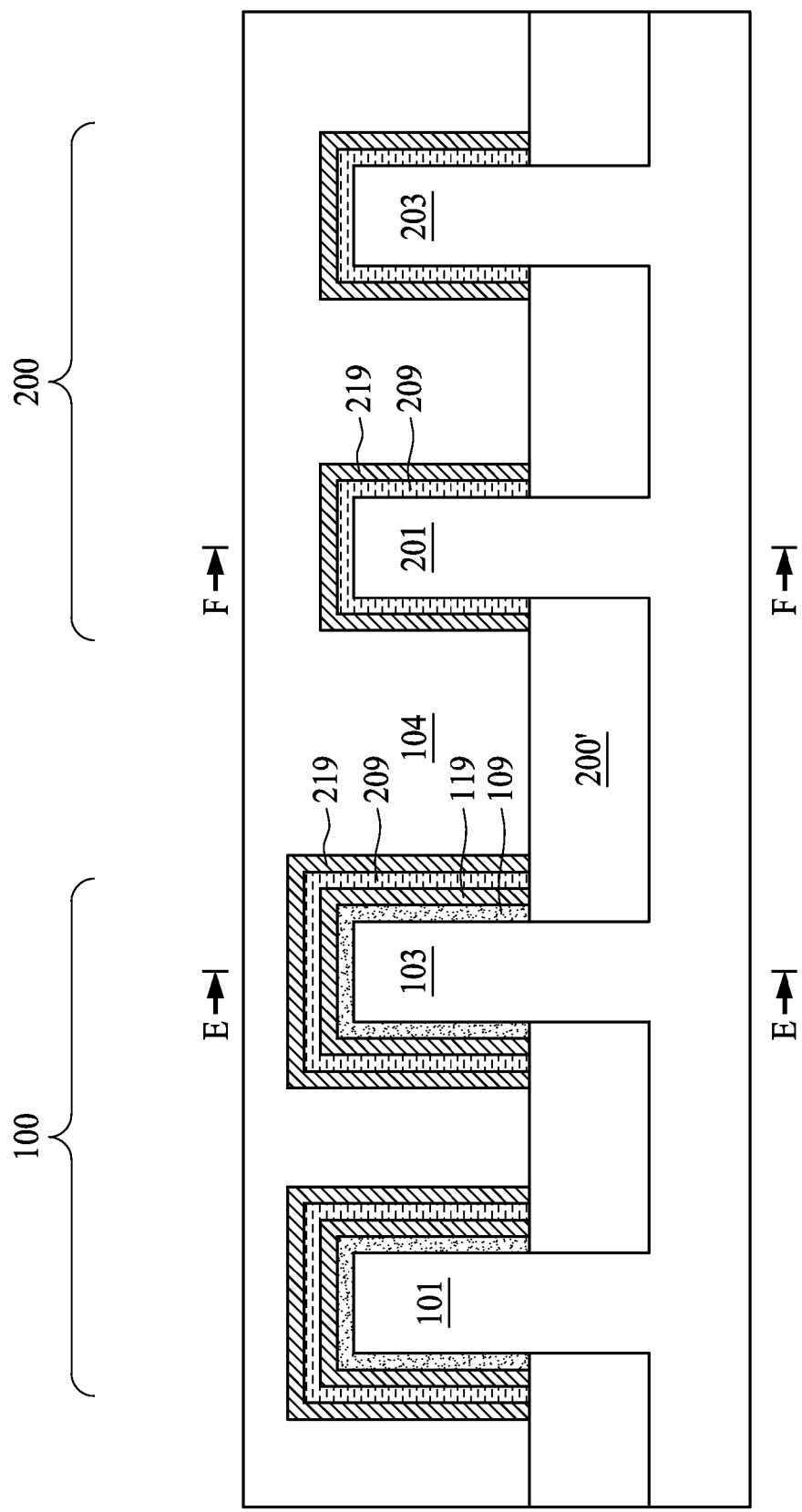
FIG. 9 shows a cross sectional view of a junction portion of a FinFET structure, in accordance with some embodiments of the present disclosure.

Referring to FIG. 9, FIG. 9 shows a cross sectional view of a junction portion of a FinFET structure, in accordance with some embodiments of the present disclosure. A difference between FIG. 8 and FIG. 9 is that a capping layer 219 is further disposed over the second dopant layer 209 of the first fin 100 and the second dopant layer 209 of the second fin 200. The capping layer 219 shown in FIG. 9 is to provide a stable seal to the second dopant layer 209 under high-temperature annealing operation as is discussed later in the present disclosure.

Figure 10:
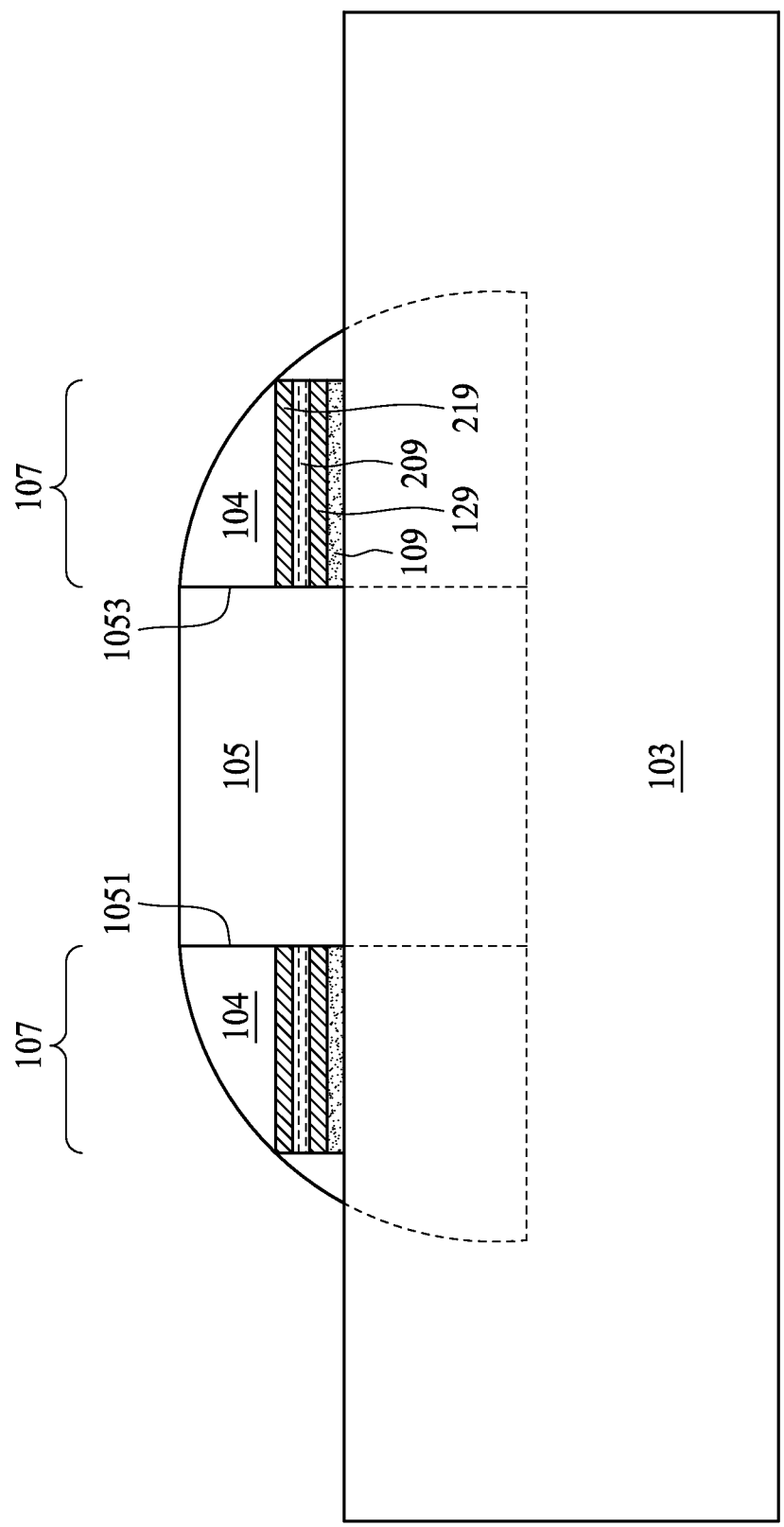
FIG. 10 shows a cross sectional view of a FinFET structure along line BB as shown in FIG. 1 and line EE as shown in FIG. 9, in accordance with some embodiments of the present disclosure.

Referring to FIG. 10, FIG. 10 shows a cross sectional view of a FinFET structure along line BB of FIG. 1 and along line EE of FIG. 9, in accordance with some embodiments of the present disclosure. The gate 105 and the sidewall spacer 104 are positioned on over the first fin 103. Dotted lines shown in FIG. 10 refer to the hidden contour of the gate 105 and sidewall spacer 104 across the first fin 103. The first dopant layer 109, the capping layer 129, the second dopant layer 209, and the capping layer 229 are sequentially disposed over the first fin 103, abutting sidewalls 1051 and 1053 of the gate 105.

Figure 11:
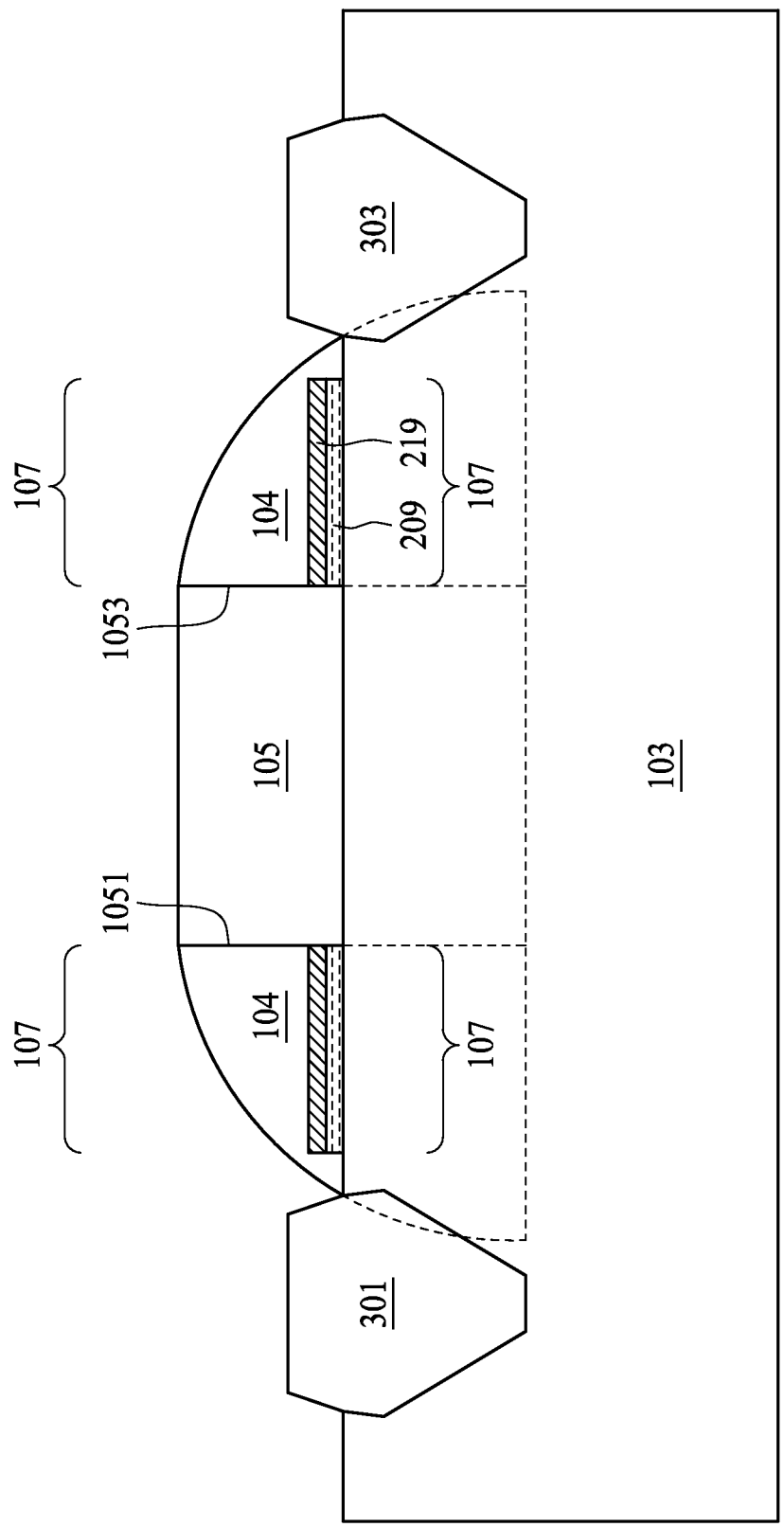
FIG. 11 shows a cross sectional view of a FinFET structure along line BB as shown in FIG. 1 and line FF as shown in FIG. 9, in accordance with some embodiments of the present disclosure.

Referring to FIG. 11, FIG. 11 shows a cross sectional view of a FinFET structure along line BB of FIG. 1 and along line FF of FIG. 9, in accordance with some embodiments of the present disclosure. The gate 105 and the sidewall spacer 104 are positioned on over the second fin 201. Dotted lines shown in FIG. 11 refer to the hidden contour of the gate 105 and sidewall spacer 104 across the first fin 103. The second dopant layer 209 and the capping layer 219 are sequentially disposed over the second fin 201, abutting sidewalls 1051 and 1053 of the gate 105. As shown in FIG. 11, a regrown source 301 and regrown drain 303 are formed partially in the second fin 201. In some embodiments, a widest portion of the regrown region is encroached under the sidewall spacer 104. In other embodiments, the widest portion of the regrown region is in contact with the tri-layer formed over the lightly doped region or LDD at the junction portion 107 of the second fin 201.

Figure 12:
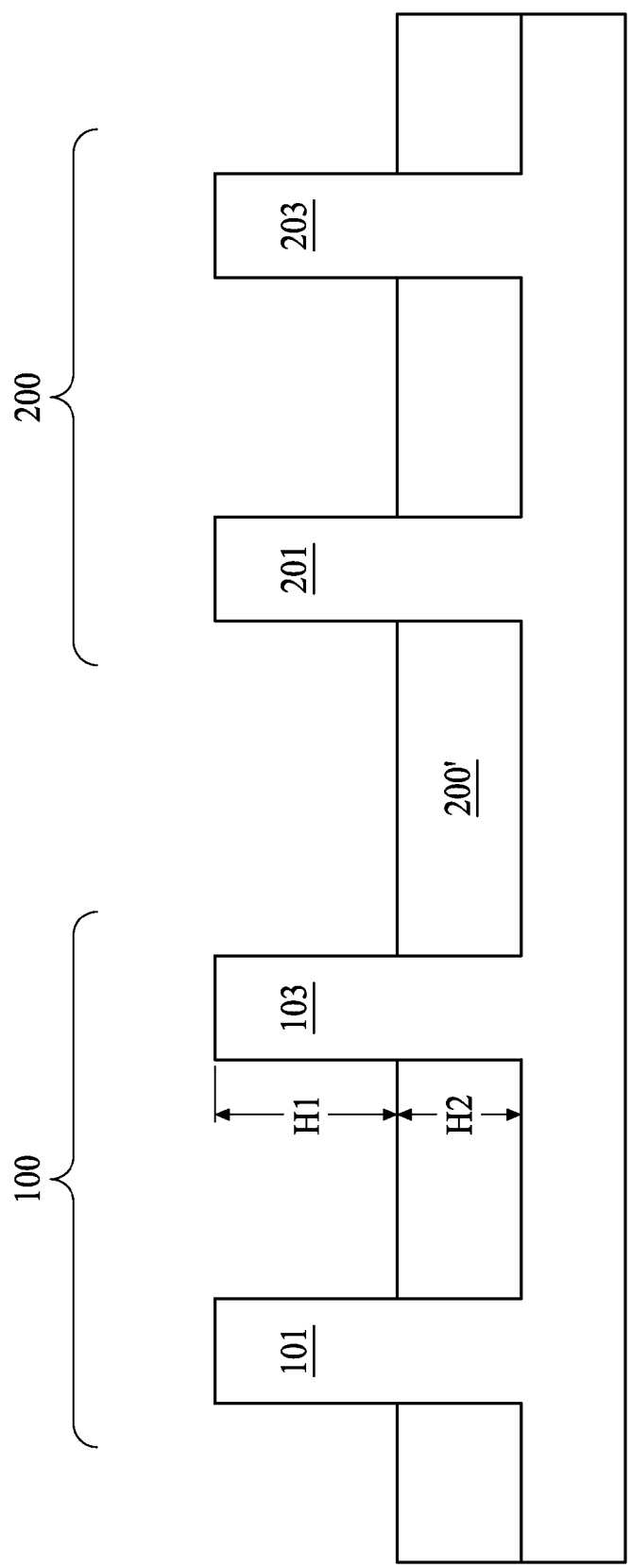
FIG. 12 to FIG. 18 show fragmental cross sectional views along line AA of FIG. 1, regarding a manufacturing method for a FinFET structure, in accordance with some embodiments of the present disclosure.

FIG. 12 to FIG. 18 show fragmental cross sectional views along line AA of FIG. 1, illustrating operations of a manufacturing method for a FinFET structure, in accordance with some embodiments of the present disclosure. In FIG. 12, several semiconductor fins 101, 103, 201, 203 are formed using photolithography and etching technique known in the art, followed by depositing an insulating layer 200' and etch back said insulating layer 200' to a predetermined height to expose a portion of the semiconductor fins. In some embodiments, a ratio of a height H1 extruding from the insulating layer 200' and a height H2 surrounded by the insulating layer 200' is in a range of from about 0.3 to about 1. Fins 101 and 103 are denoted as "first set of fins" 100. Fins 201 and 203 are denoted as "second set of fins" 200 in the present disclosure. The first set of fins 100 and the second set of fins 200 may possess dopants of different conductive types.

Figure 13:
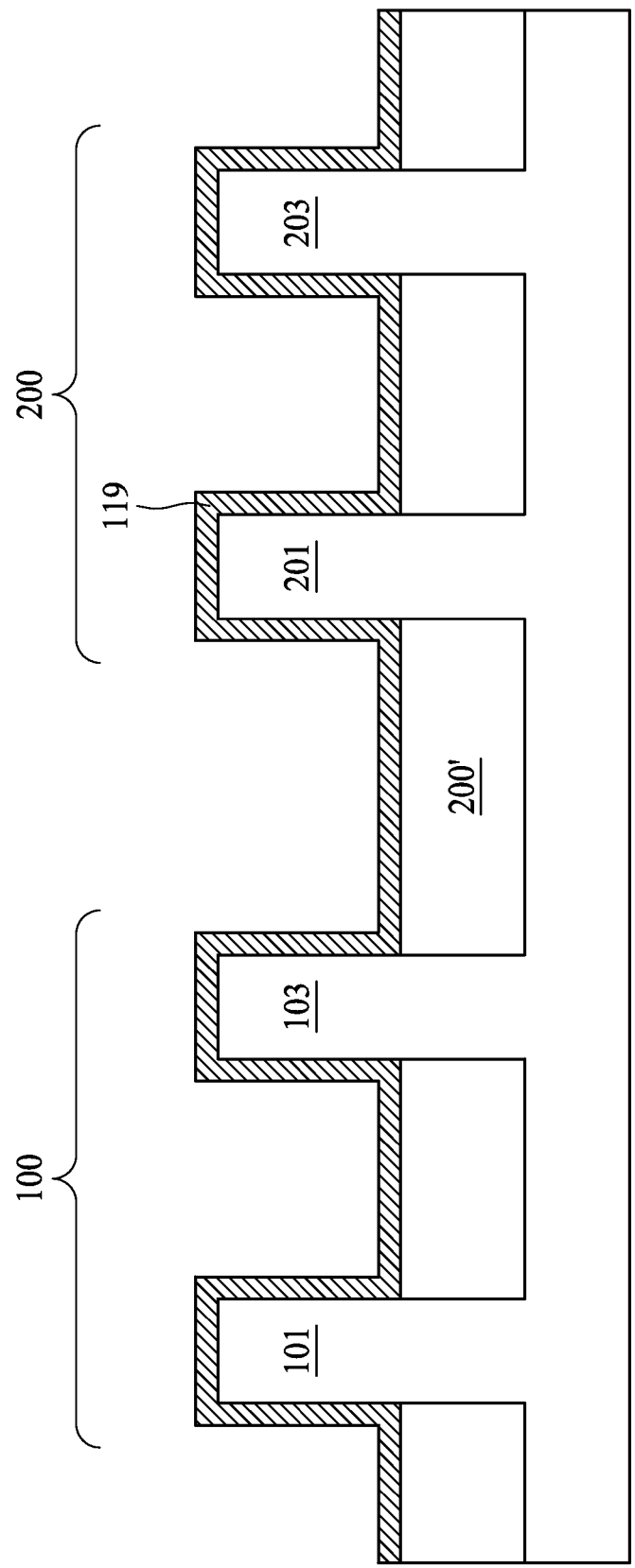
Figure 14:
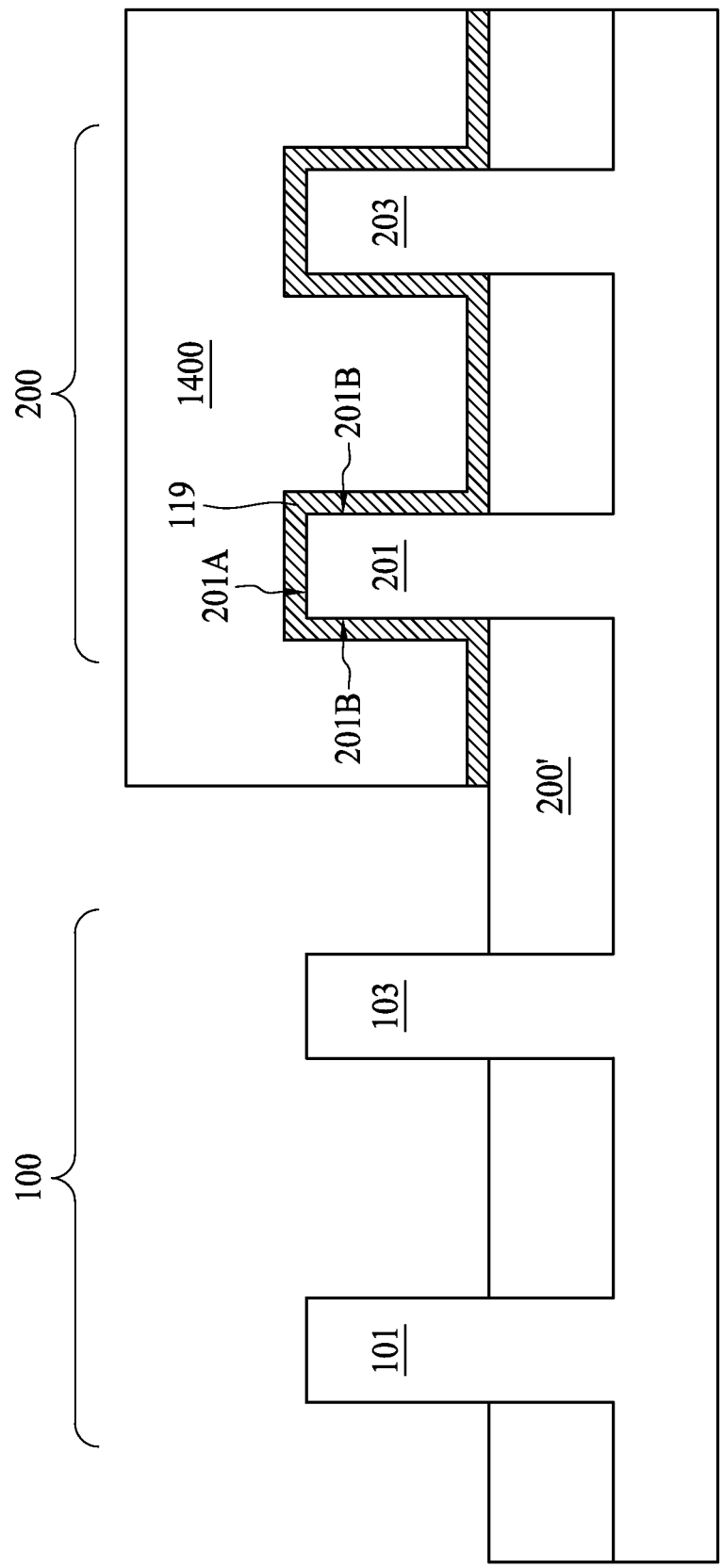

Referring to FIG. 13 and FIG. 14, a diffusion barrier 119 is formed over a top surface 201A and sidewalls 201B of the second set of fins 200. In FIG. 13, a blanket deposition of a diffusion barrier 119 is conducted to cover all fins, followed by a photolithograph and etching operations to remove the portion of the diffusion barrier 119 disposed over the first set of fins 100, as shown in FIG. 14. The patterned masking layer 1400 can be photoresist. In some embodiments, the diffusion barrier 119 can be a SiN layer with a thickness of from about 3 nm to about 8 nm. $H_3PO_4$-based chemistry can be used to remove the SiN layer. In some embodiments, a bottom anti-reflection coating (BARC) is deposited comformally over the diffusion barrier 119 before the formation of the masking layer 1400. In some embodiments, an oxide layer (not shown) is deposited over the fins before the deposition of the diffusion barrier 119, for example, in the I/O region of a semiconductor chip. Therefore, an additional operation is conducted to remove the oxide layer and until the first set of fins 100 is exposed.

Figure 15:
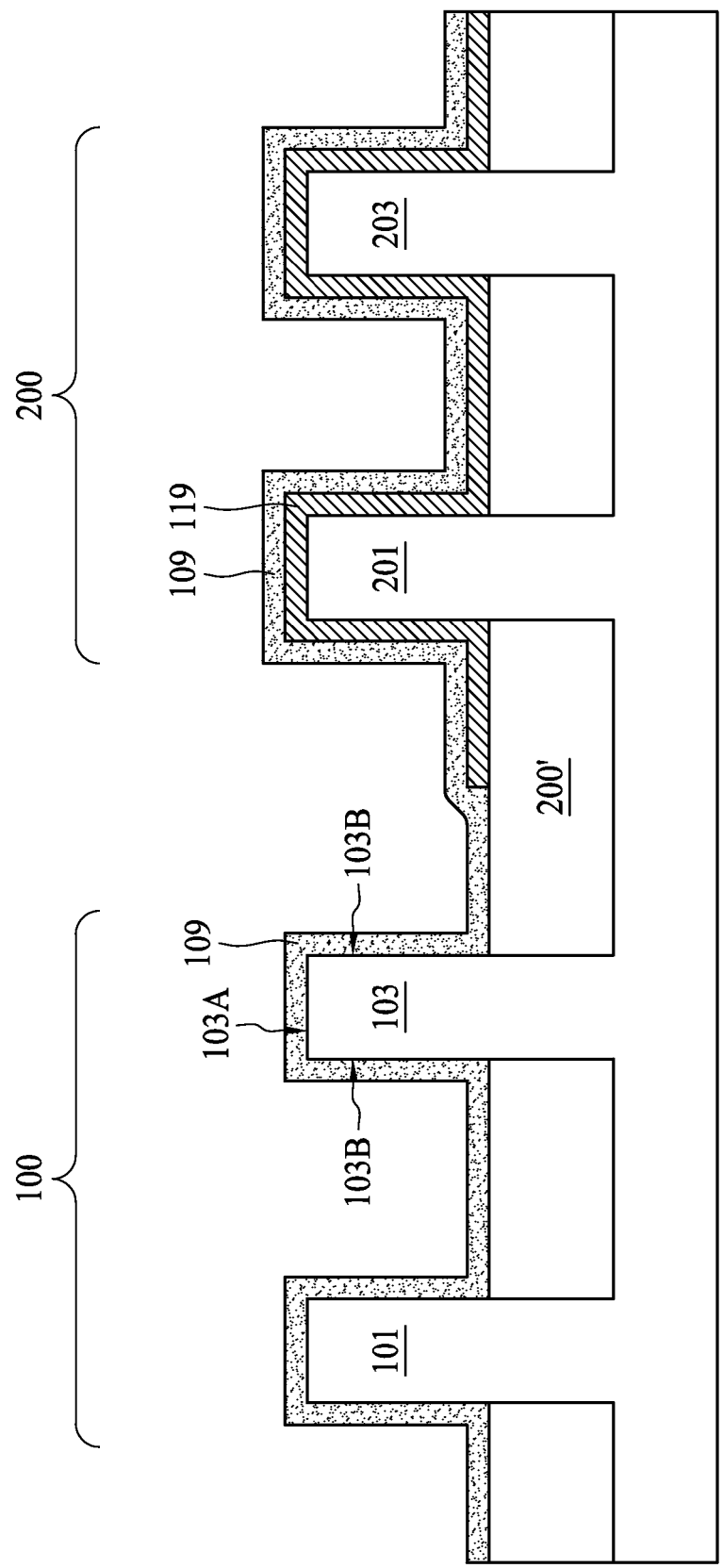

Referring to FIG. 15, after the removal of the masking layer 1400 in FIG. 14, a first dopant layer 109 containing dopants of a first type, for example, n-type dopants such as phosphor or arsenic, is conformally deposited over all fins. In some embodiments, atomic layer deposition (ALD) is adopted to deposit the first dopant layer 109. ALD is used in the operation to achieve atomic level thickness control of the layer deposited. In some embodiments, a plasma-enhanced ALD (PEALD) is used to deposit a PSG layer with a thickness of from about 2 nm to about 8 nm. The PSG layer may contain a first dopant concentration greater than or about $1E22/cm^3$. In addition, PEALD can be used to form a graded first dopant layer 109, in which the first dopant concentration is greater in proximity to the fin and gradually decreases as the position moves away from the fin. In FIG. 15, the first dopant layer 109 is in direct contact with the top surface 103A and sidewalls 103B of the first set of fins 100 but is separated from the second set of fins 200 by the diffusion barrier 119.

Figure 16:
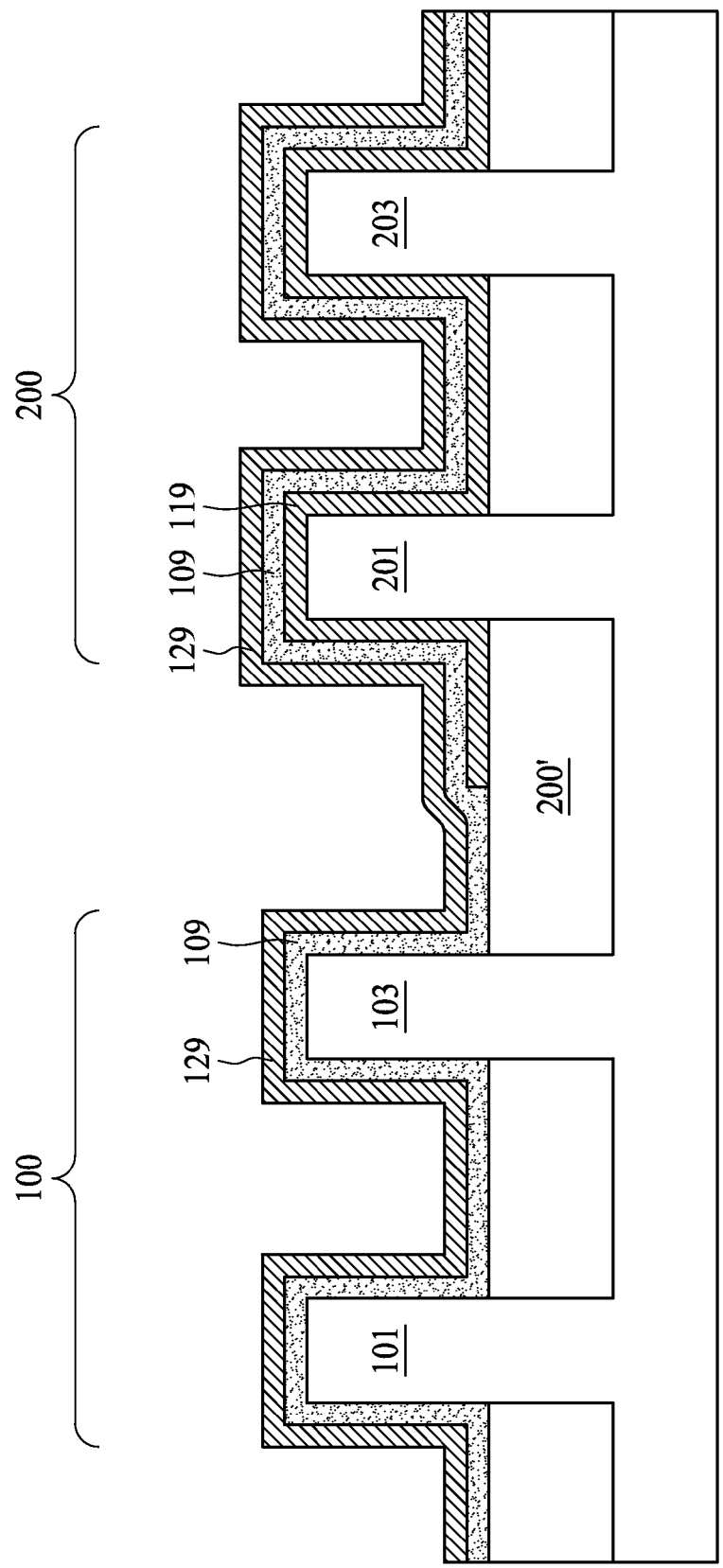

Referring to FIG. 16, a capping layer 129 can be optionally deposited over the first dopant layer 109 previously deposited over the first set of fins 100. In some embodiments, the capping layer 129 can be deposited by ALD or PEALD for a thickness of from about 8 nm to about 12 nm. In some embodiments, the capping layer 129 includes an offset sidewall deposition and a dummy sidewall deposition. Referring to FIG. 15 and FIG. 16, the ALD operation of the first dopant layer 109 and the capping layer 109 can be conducted in a single operation. In some embodiments, the capping layer contains nitride materials.

Figure 17:
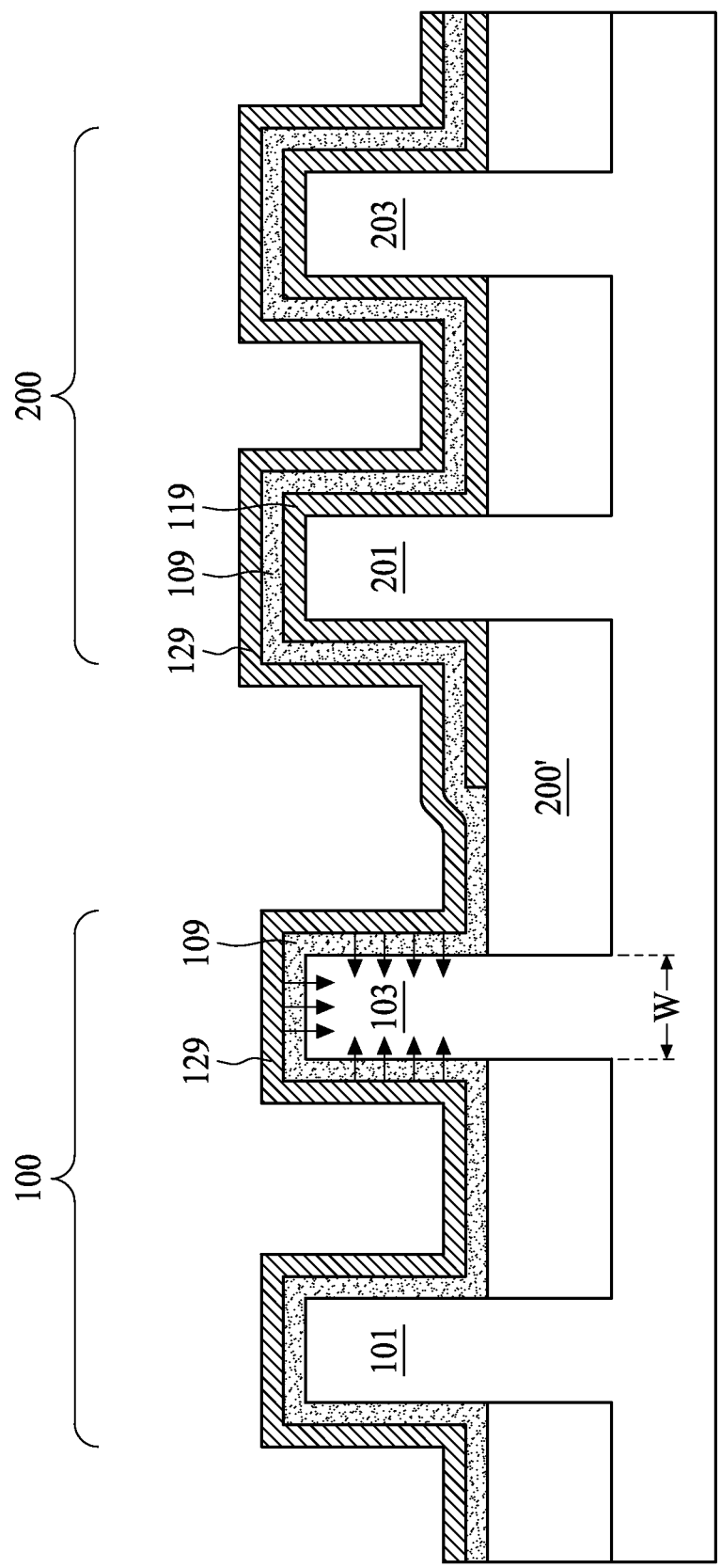

Referring to FIG. 17, an annealing operation is carried out to diffuse the dopants from the first dopant layer 109 to the first set of fins 100. In some embodiments, the annealing operation includes a spike anneal under a temperature of from about 950 degrees Celsius to about 1050 degrees Celsius at a duration of from about 1.5 to 10 seconds. As shown in FIG. 17, dopants in the first dopant layer 109 positioned over the second set of fins 200 is blocked by the diffusion barrier 119, preventing the first dopants diffuse in to the second set of fins 200. In some embodiments, spike anneal at 1000 degrees Celsius and a duration of 1 second, dopant concentration higher than $1E19/cm^3$ can be measured at 25 nm below the interface of the fin and the dopant layer by a secondary ion mass spectrometry (SIMS) measurement. Similarly, spike anneal at 1000 degrees Celsius and duration of 10 seconds, dopant concentration higher than $1E19/cm^3$ can be measured at 60 nm below the interface. The capping layer 129 formed in FIG. 16 can be used as a robust shield to prevent the first dopant layer 109 from volatilization under the annealing operation.

Figure 18:
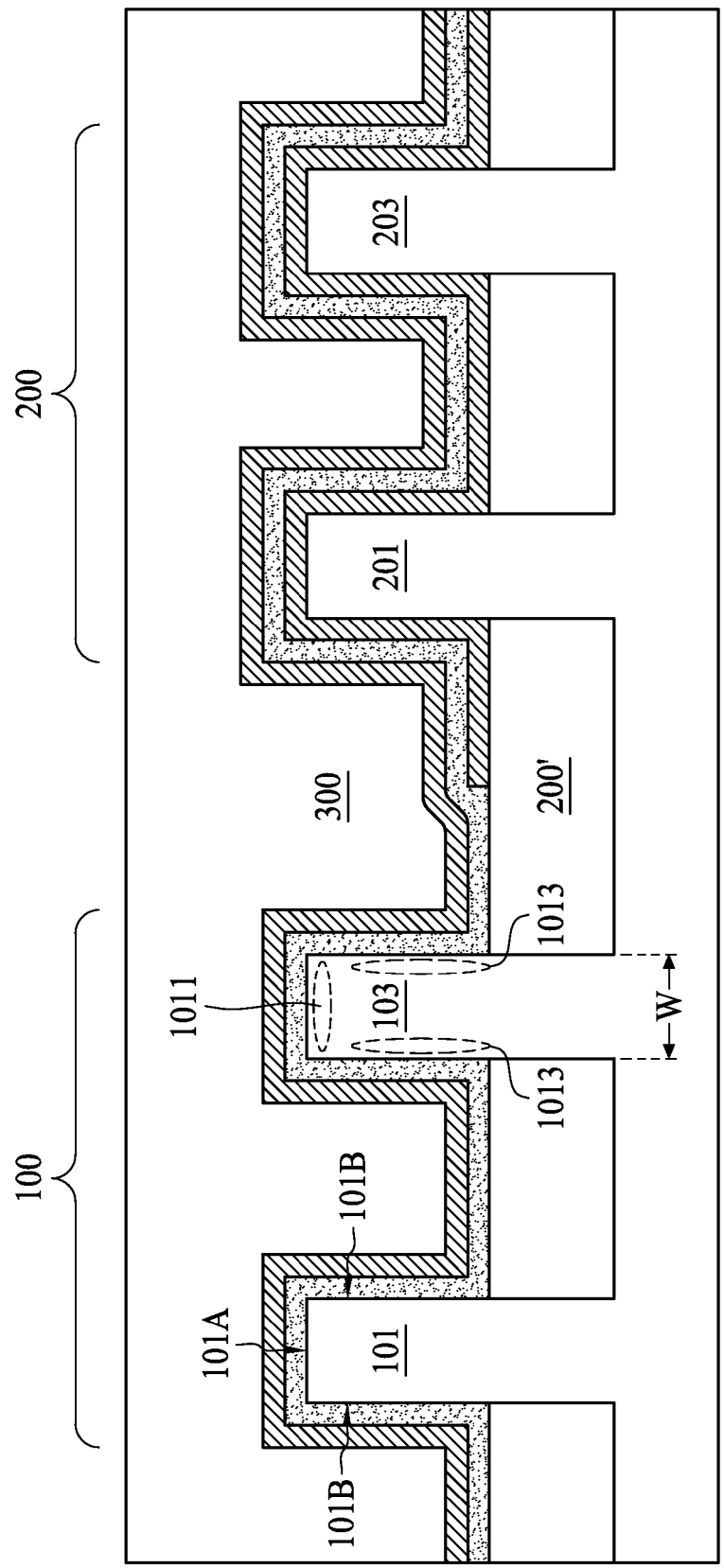

In some embodiments, an average semiconductor fin width W is about 10 nm to 15 nm, the diffusion profile after spike anneal can effectively cover the width W of the semiconductor fin, and hence, as shown in FIG. 18, the dopant concentration at the top region 1011 and the sidewall regions 1013 of the first set of fins 100 are substantially identical. Furthermore, the dopant concentration at the cross section of the first set of fins 100 shows an invert U shape contour (not shown) along the top surface 101A and sidewalls 101B of the first set of fins 100.

In FIG. 18, a cover layer 300 can be formed over the first set and the second set of fins. In some embodiments where only the junction portion of an n-type fin is intended to be doped, the cover layer 300 can be a sidewall spacer as discussed previously in FIGS. 1-11. In other embodiments, when the junction portions of both an n-type fin and a p-type fin are intended to be doped, the cover layer 300 can be a photoresist. FIG. 19 to FIG. 22 show operations to further dope the p-type fins after the doping of the n-type fins. It is understood that an n-type LDD doping or a p-type LDD doping can be carried out independently using the above described operations or equivalent measures. The sequence of conducting the n-type LDD doping and the p-type LDD doping is not a limitation provided in the present disclosure.

Figure 19:
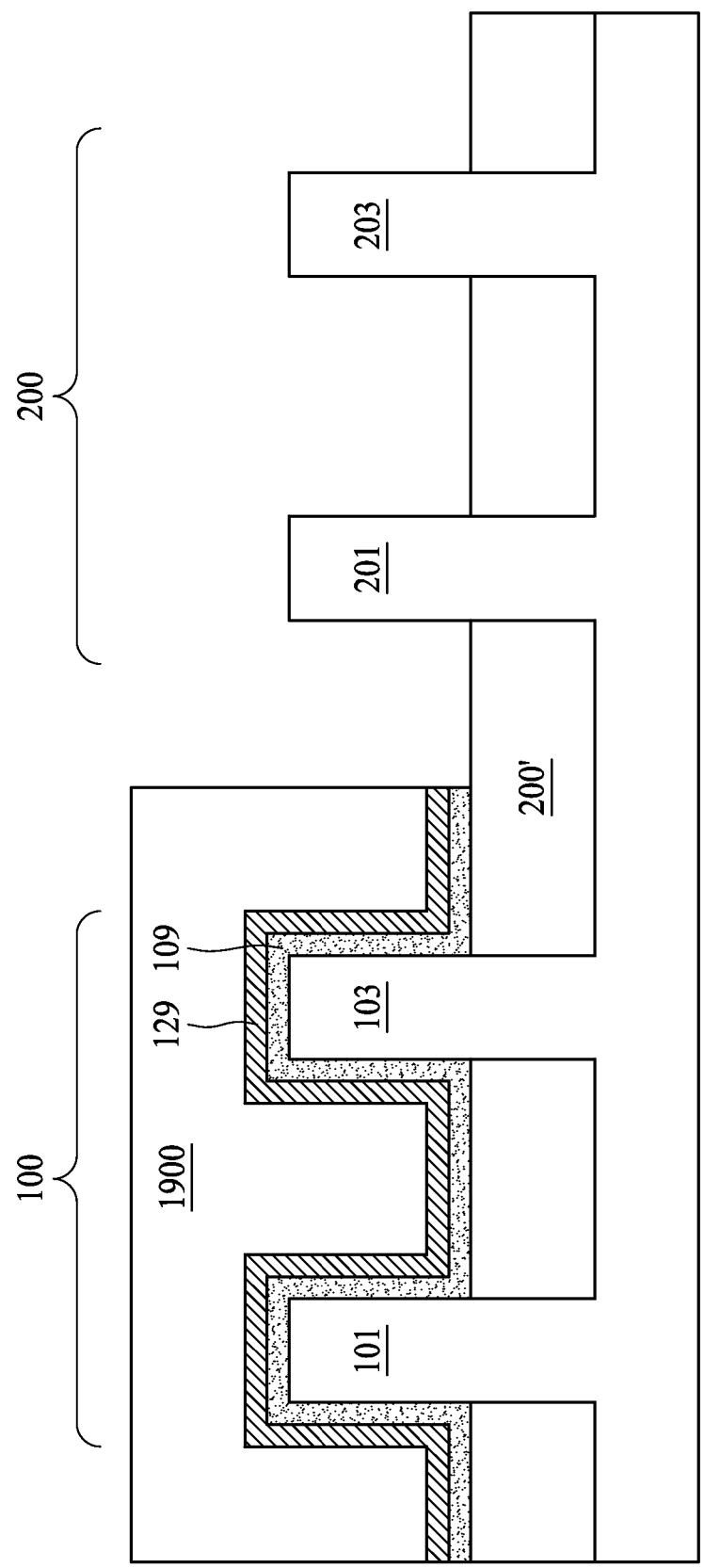
FIG. 19 to FIG. 22 show fragmental cross sectional views along line AA of FIG. 1, regarding a manufacturing method for a FinFET structure, in accordance with some embodiments of the present disclosure.
Figure 20:
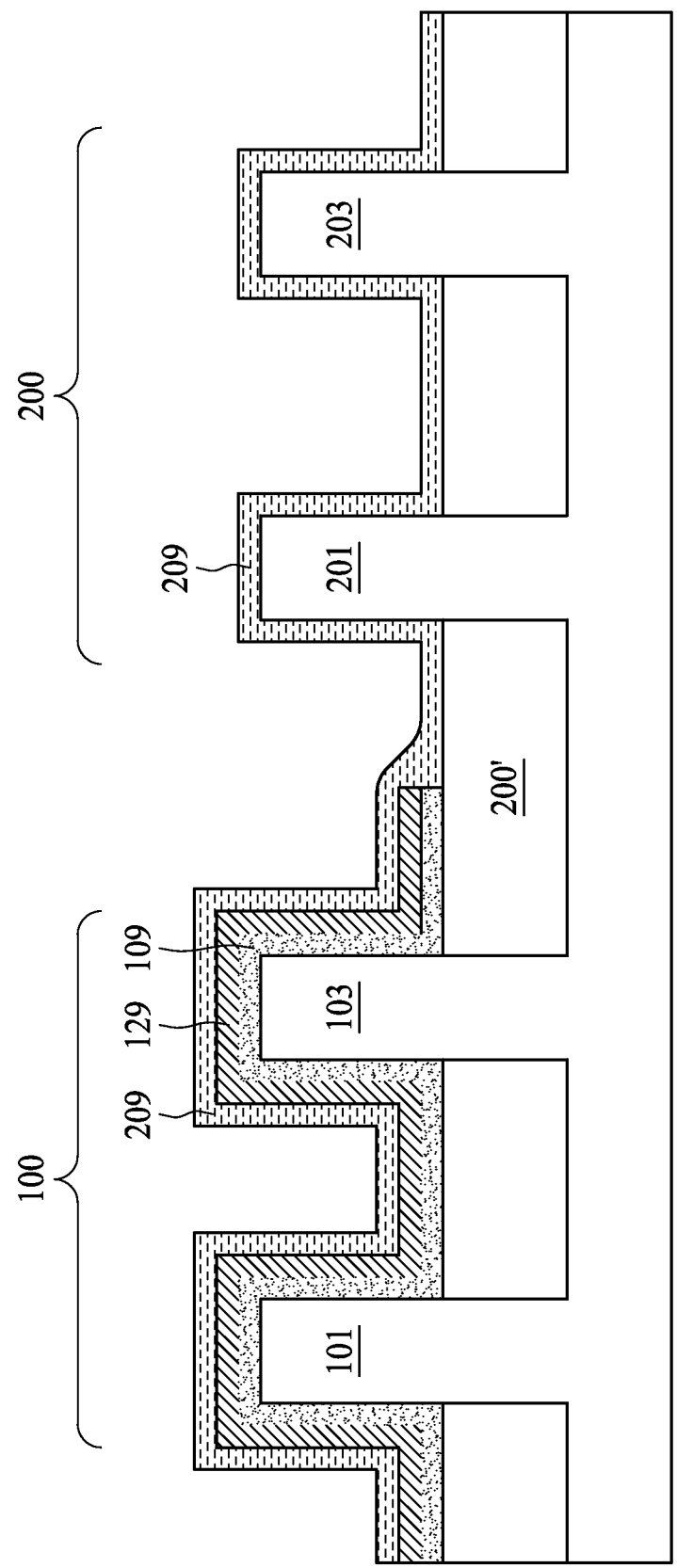
Figure 21:
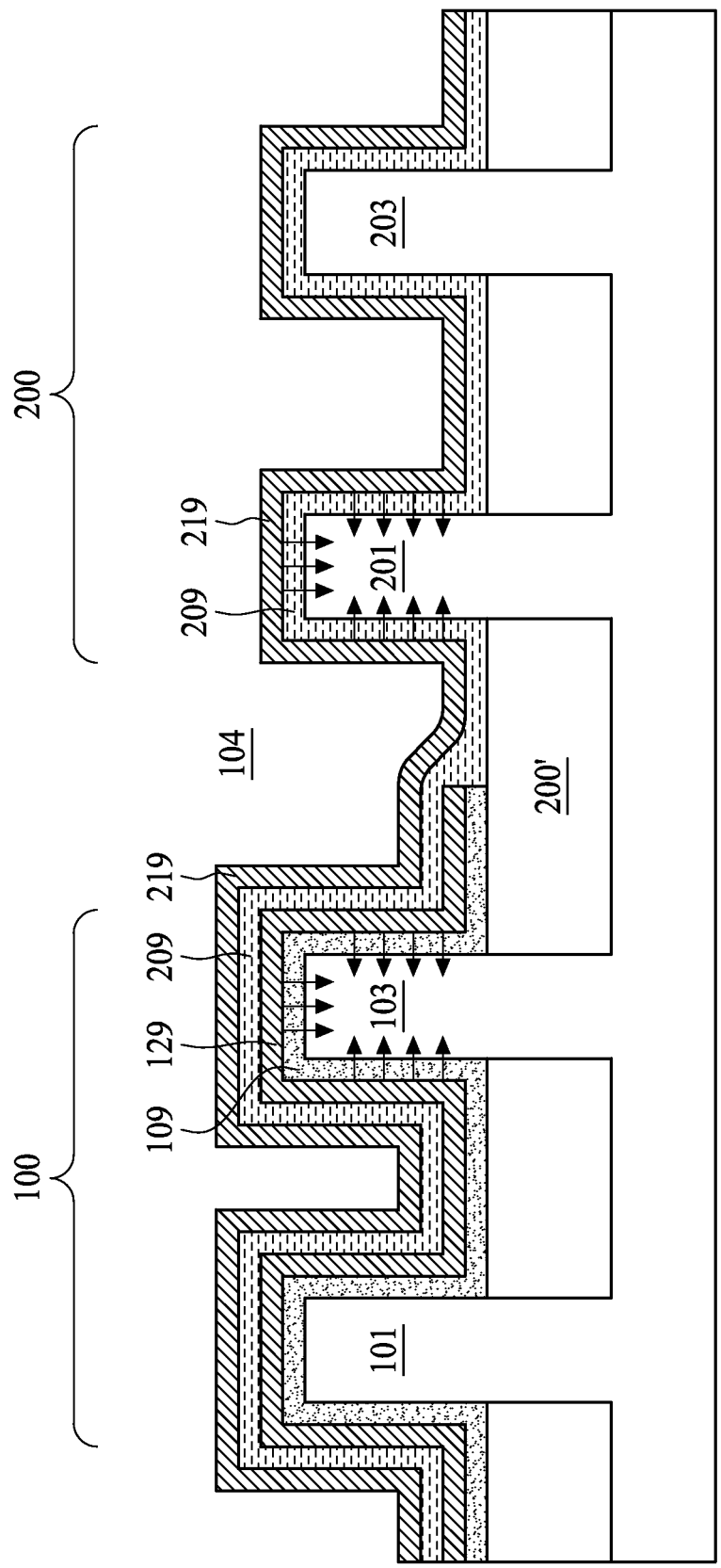
Figure 22:
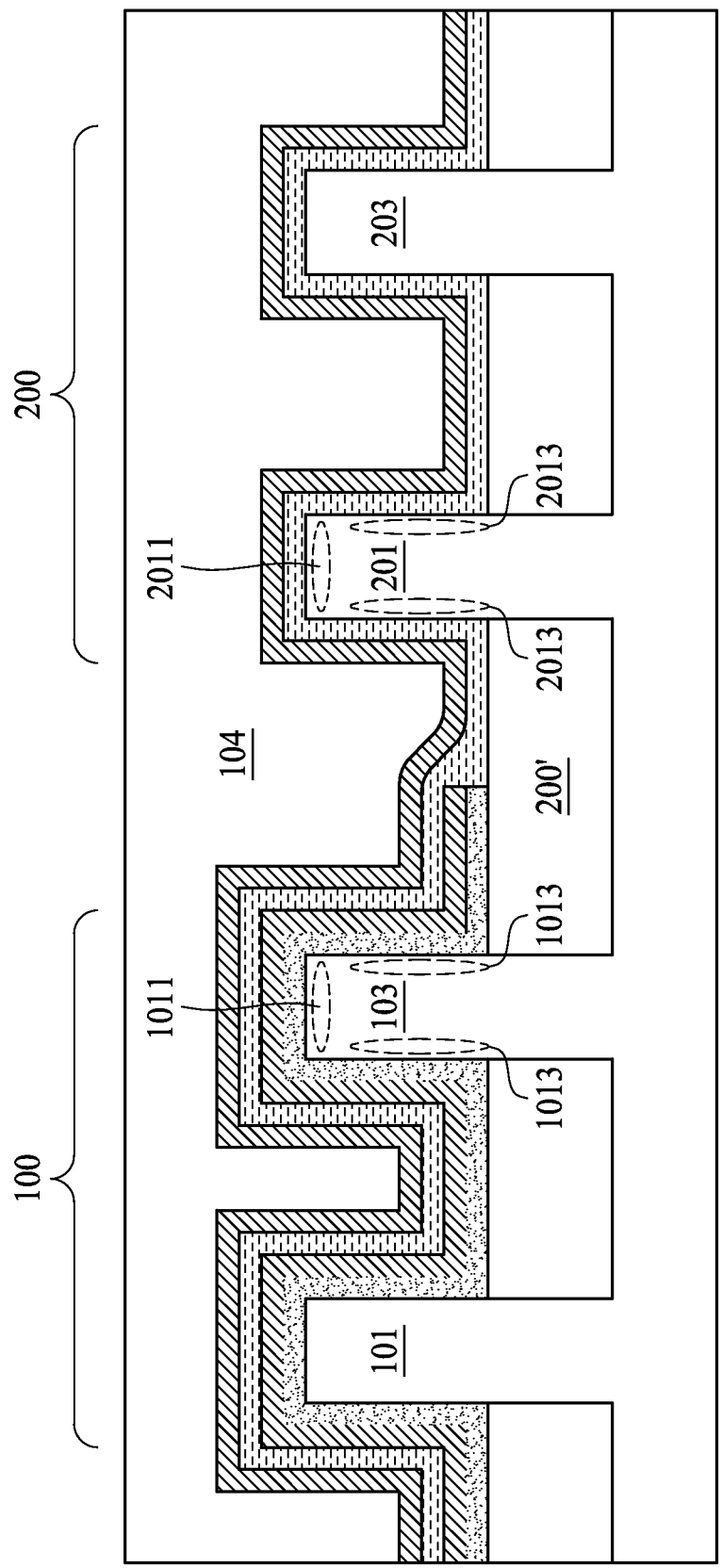

In FIG. 19, a photoresist 1900 is patterned and the diffusion barrier 119, the first dopant layer 109, the capping layer 129 are removed by suitable etching operations to expose the second set of fins 200. After the removal of the photoresist 1900, in FIG. 20, a second dopant layer 209 is deposited over the second set of fins 200 in a similar condition as previously described in FIG. 15. The second dopant layer 209 contains dopants of a second type such as boron. BSG or boron-doped oxides can be used to from the second dopant layer 209. In some embodiments, the annealing operation can be conducted before or after the deposition of the second dopant layer 209. As shown in FIG. 21, an optional capping layer 219 is formed over the second dopant layer 209 as previously described in FIG. 16, followed by an annealing operation. The second dopants in the second dopant layer 219 and the first dopants in the first dopant layer 109 diffuse into the second set of fins 200 and the first set of fins 100, respectively. In FIG. 22, a sidewall spacer 104 is formed to cover all fins. Second dopant concentration at the top region 2011 and sidewall region 2013 of the second set of fins 200 are substantially identical. In the same device, first dopant concentration at the top region 1011 and sidewall region 1013 of the first set of fins 100 are substantially identical.

Figure 23:
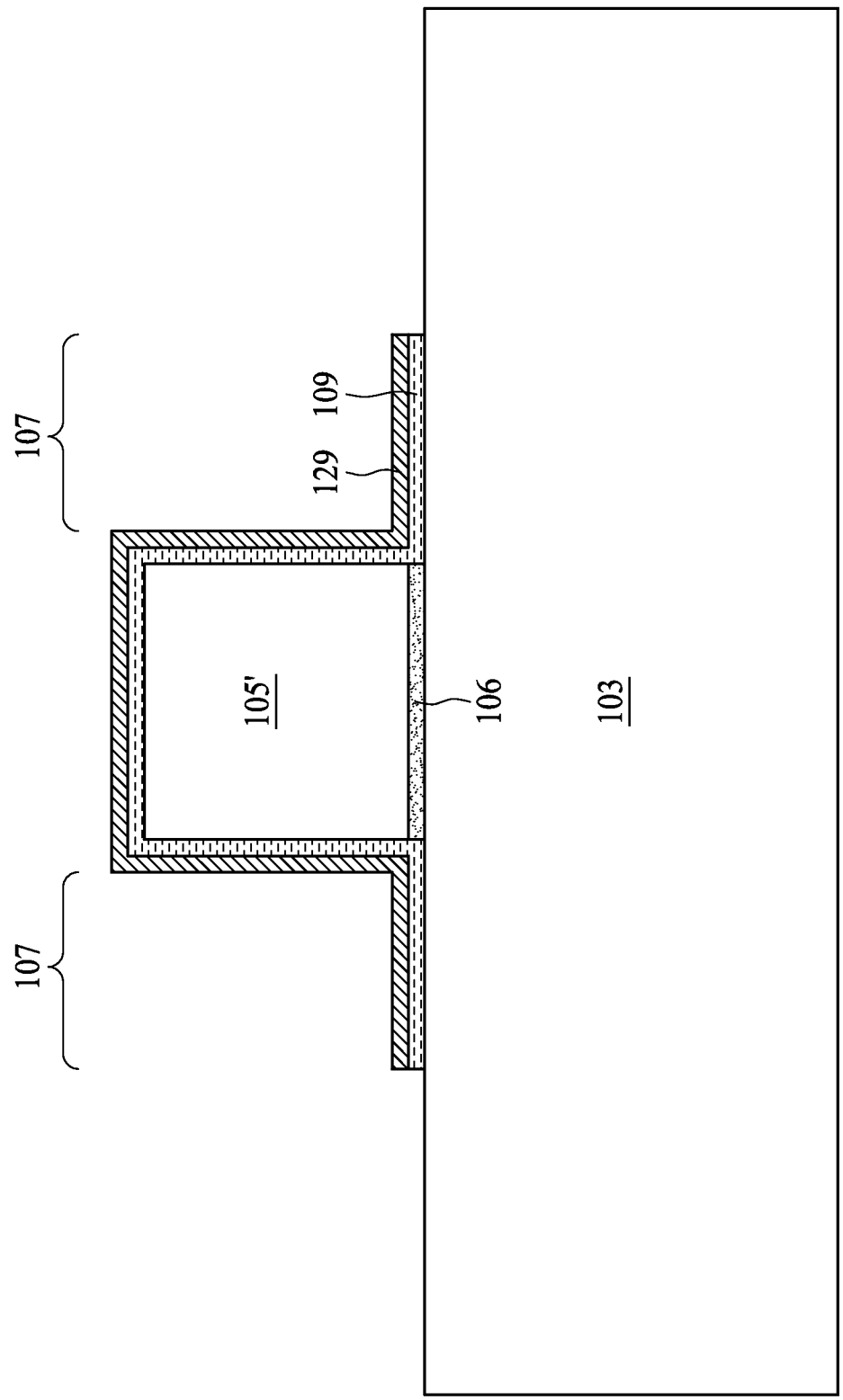
FIG. 23 to FIG. 29 show fragmental cross sectional views along line BB of FIG. 1, regarding a manufacturing method for a FinFET structure, in accordance with some embodiments of the present disclosure.
Figure 24:
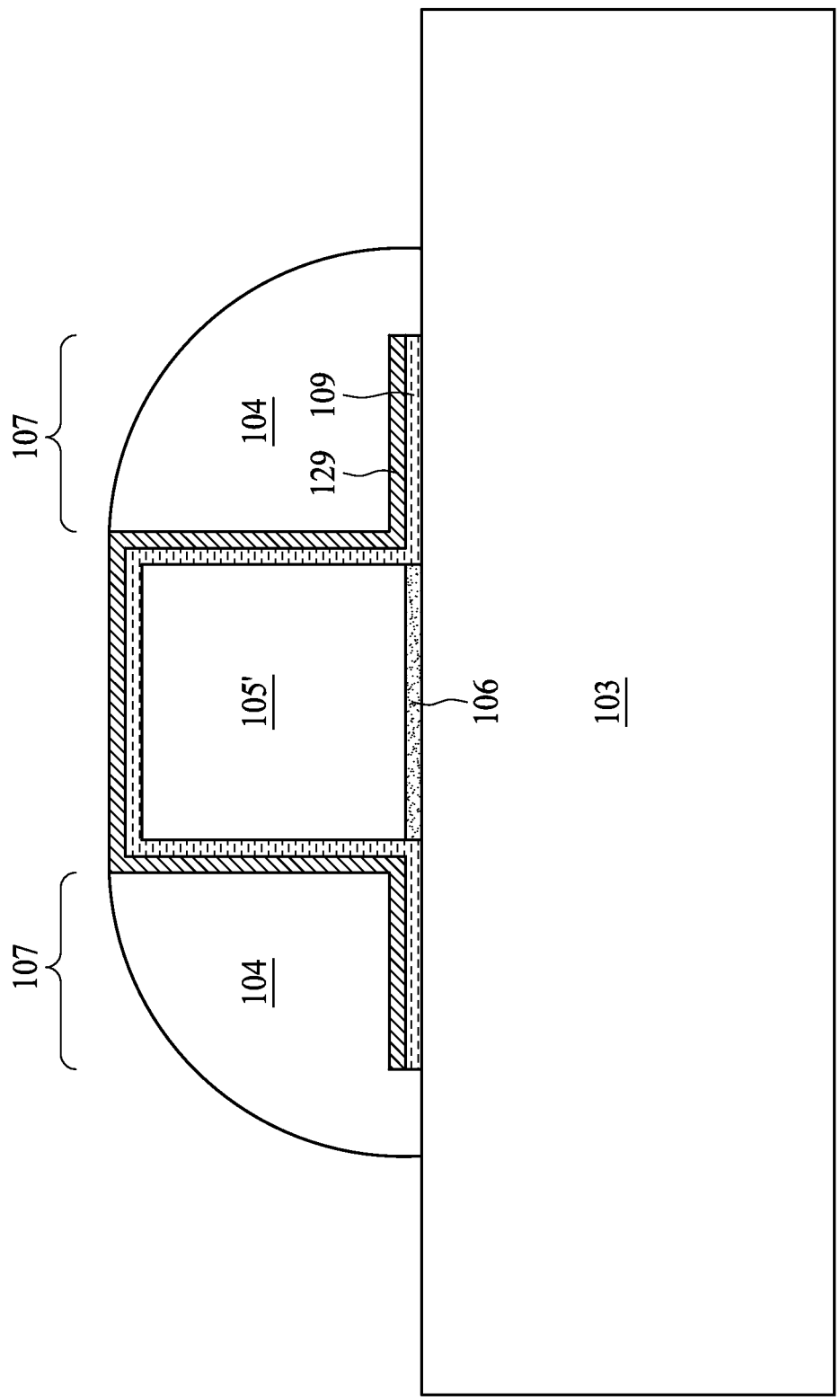
Figure 25:
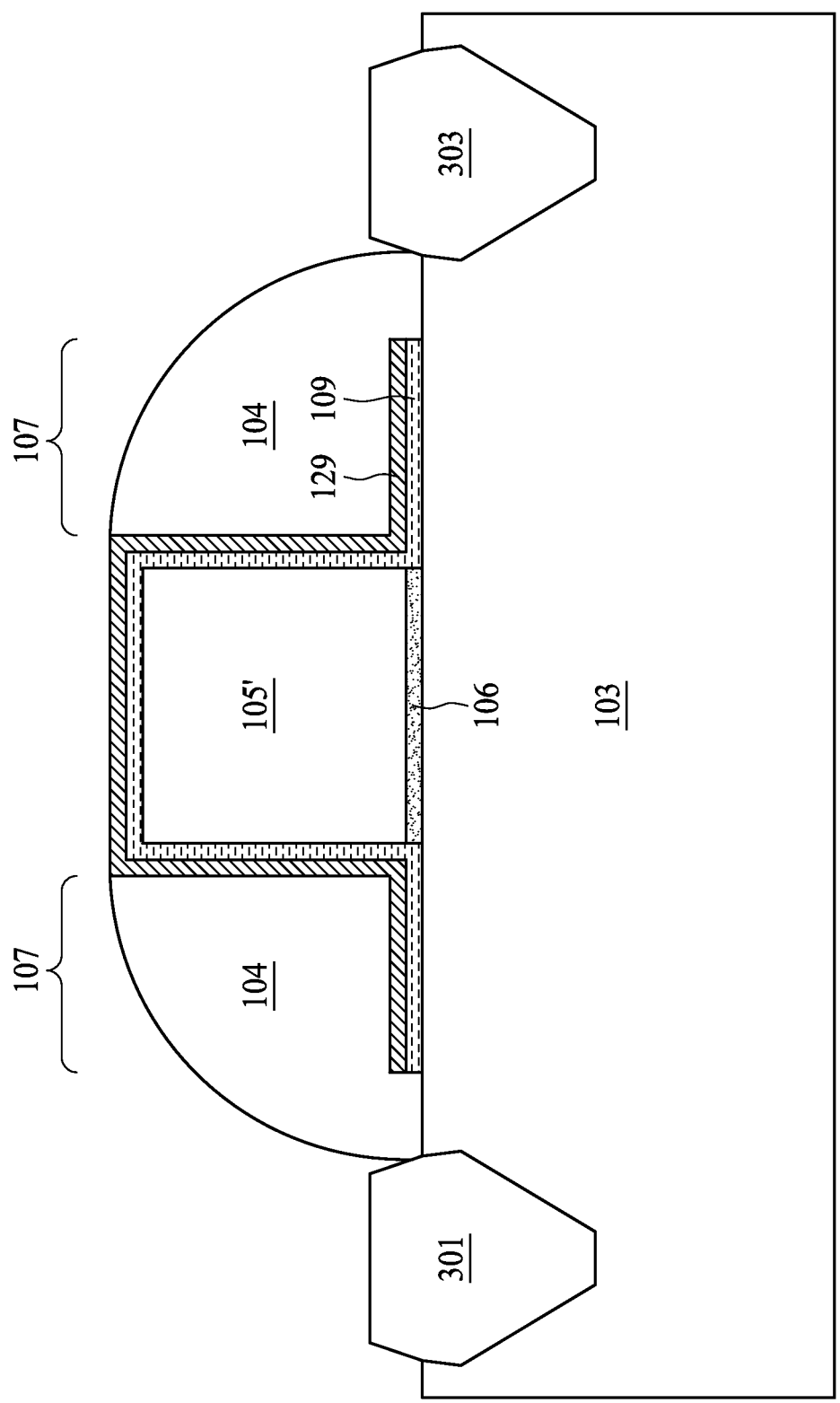

FIG. 23 to FIG. 29 are fragmental cross sectional views along line BB of FIG. 1, showing operations after the formation of the first dopant layer 109 over the junction portion 107 of a first fin 103. In FIG. 23, an optional oxide layer 106 is formed under the replacement gate 105' and over the first fin 103. In some embodiments, the optional oxide layer is blanket deposited after the semiconductor fins are formed, for example, in the I/O region of a device. The first dopant layer 109 and capping layer 129 are subsequently formed conformally over the junction portion 107 and the replacement gate 105'. In FIG. 24, sidewall spacer 104 is formed to cover at least the junction portion 107 and thus the first dopant layer 109. Other dielectric layer is further formed to surround the sidewall spacer 104 but is not shown in FIG. 24 for purpose of simplicity. In FIG. 25, regrown source 301 and regrown drain 303 are formed in the first fin 103, abutting the sidewall spacer 104. In some embodiments, the regrown source and drain is formed by depositing suitable materials in recesses (not shown) preformed in the first fin 103. The first fin 103 is exposed to a pulse of phosphorous-containing, carbon-containing, and silicon-containing source vapors to deposit an epitaxial material in the recesses. In some embodiments, the pulse further comprises a carbon-containing source vapor and a silicon-containing source vapor. In some embodiments, the phosphorous-containing source vapor containing $PH_3$ further having a flow rate of between approximately 260 sccm and approximately 310 sccm. In some embodiments, the carbon-containing source vapor containing monomethyl silane (MMS) further having a flow rate of between approximately 132 sccm and approximately 120 sccm. In some embodiments, the silicon-containing source vapor containing $SiH_4$ or $Si_3H_8$ having a flow rate of approximately 190 sccm. In some embodiments, the epitaxial material has a phosphorous concentration between approximately $2E21/cm^3$ and approximately $5E21/cm^3$, configured to produce a tensile strain within the channel.

Figure 26:
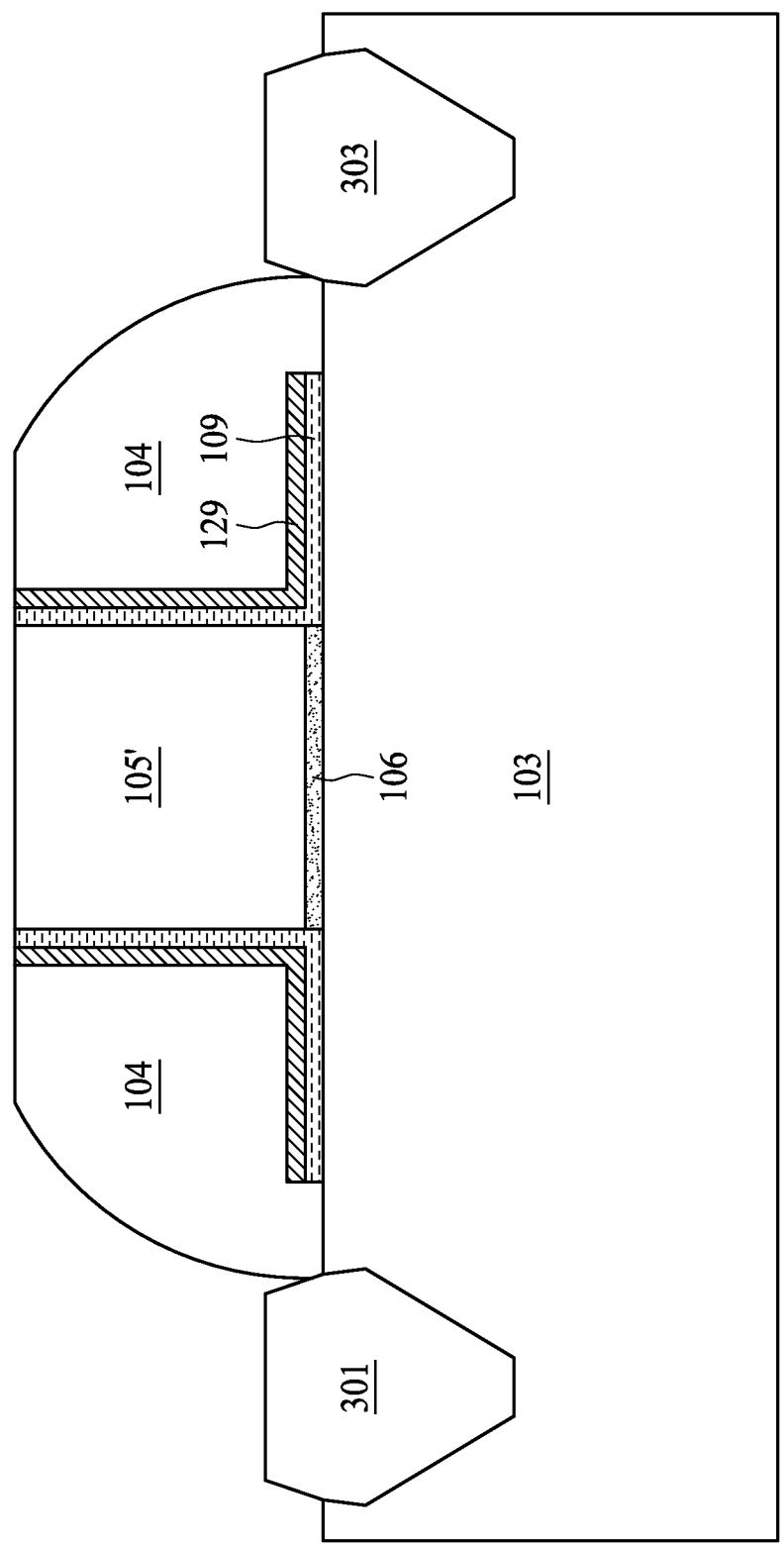
Figure 27:
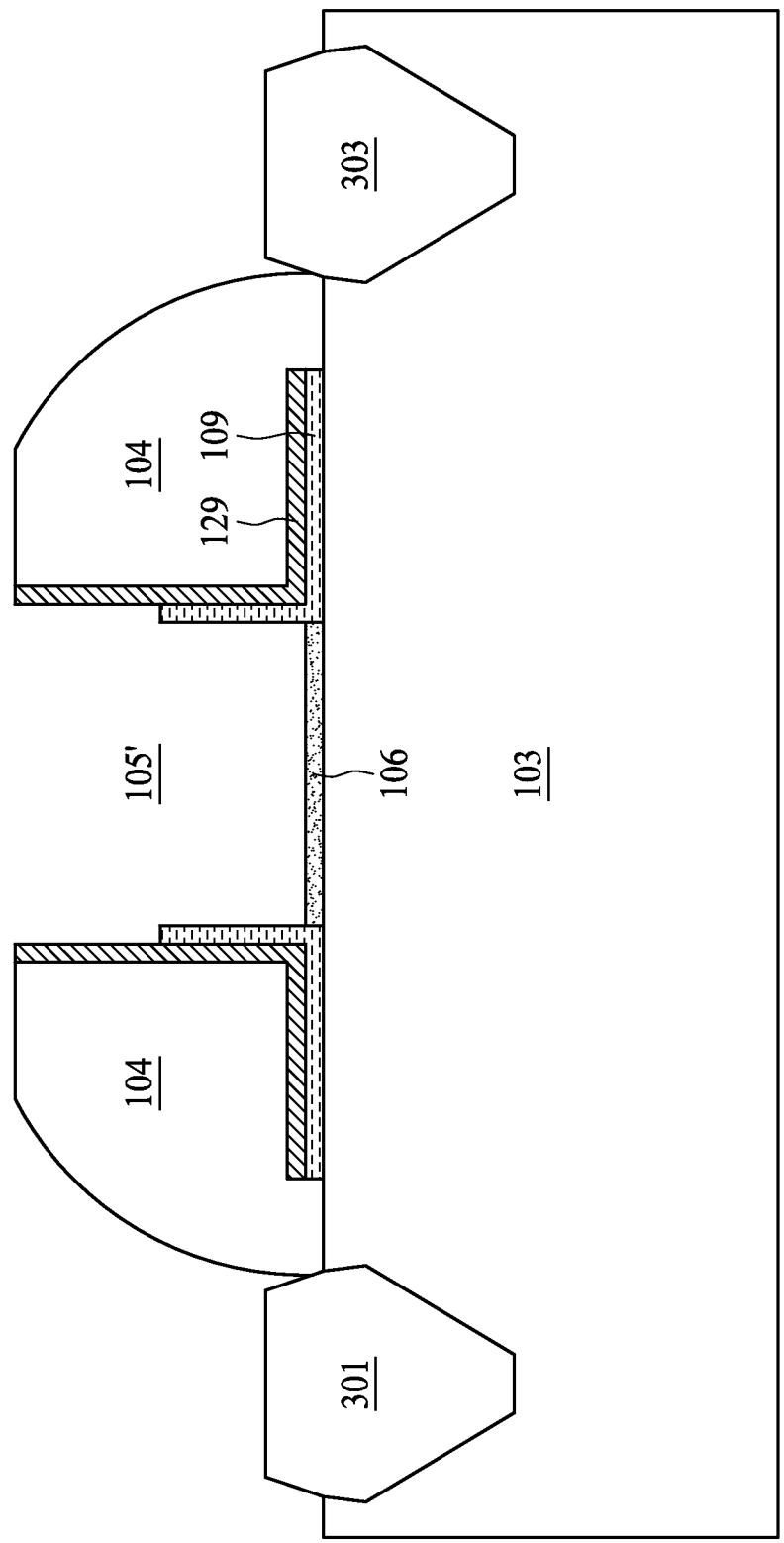
Figure 28:
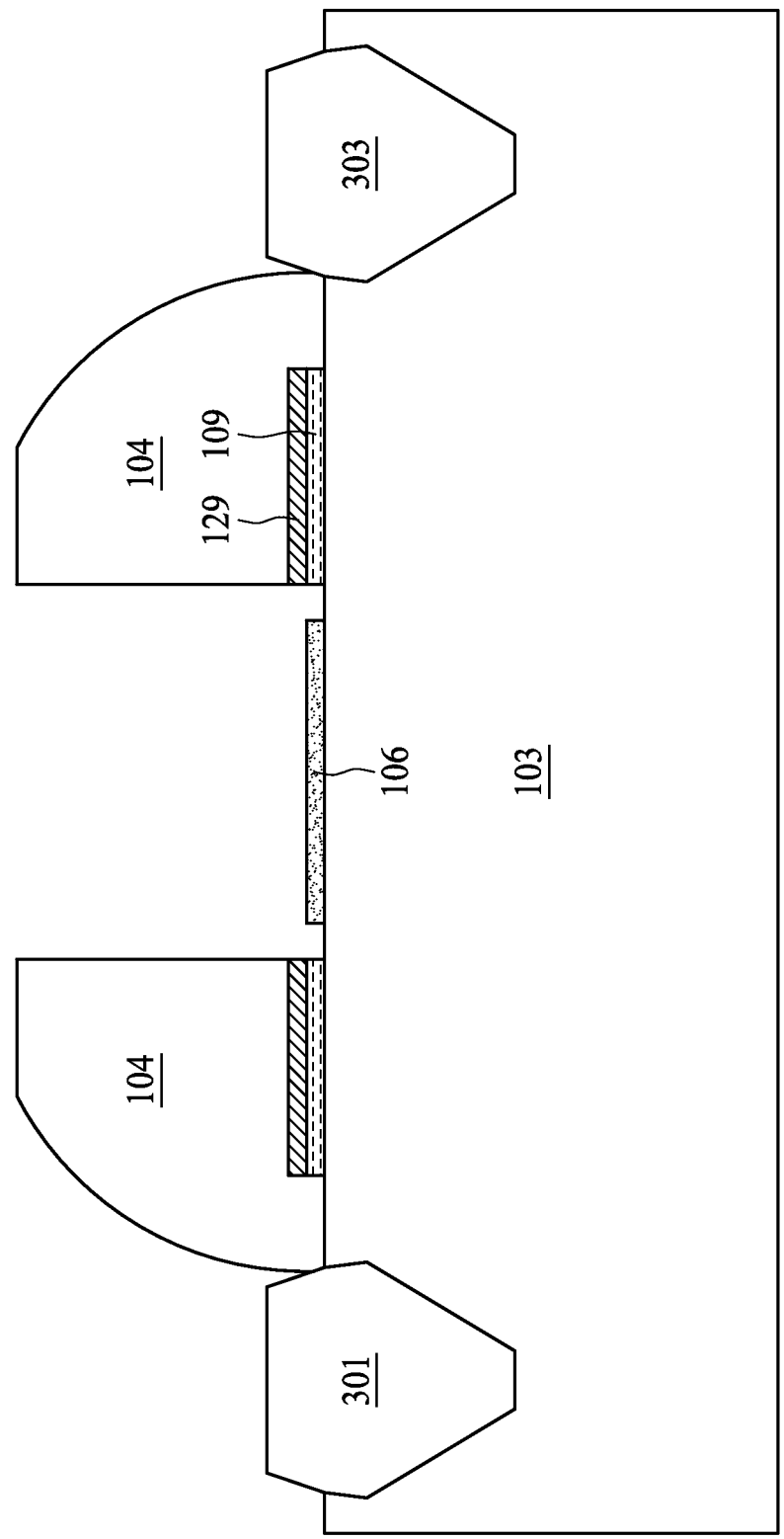

In FIG. 26, a planarization operation such as a chemical mechanical polishing operation is carried out to remove a portion of the sidewall spacer 104 and the first dopant layer 109, and thus the replacement gate 105' is exposed. FIG. 27 shows the removal of the replacement gate 105' by an etching operation, for example, a dry etch operation. The first dopant layer 109 may be partially removed during the dry etch operation. Subsequently, a wet etch operation is conducted as shown in FIG. 28. Both the capping layer 129 and the remaining first dopant layer 109 can be removed in the wet etch operation. The oxide layer 106 is removed using suitable etching operation.

Figure 29:
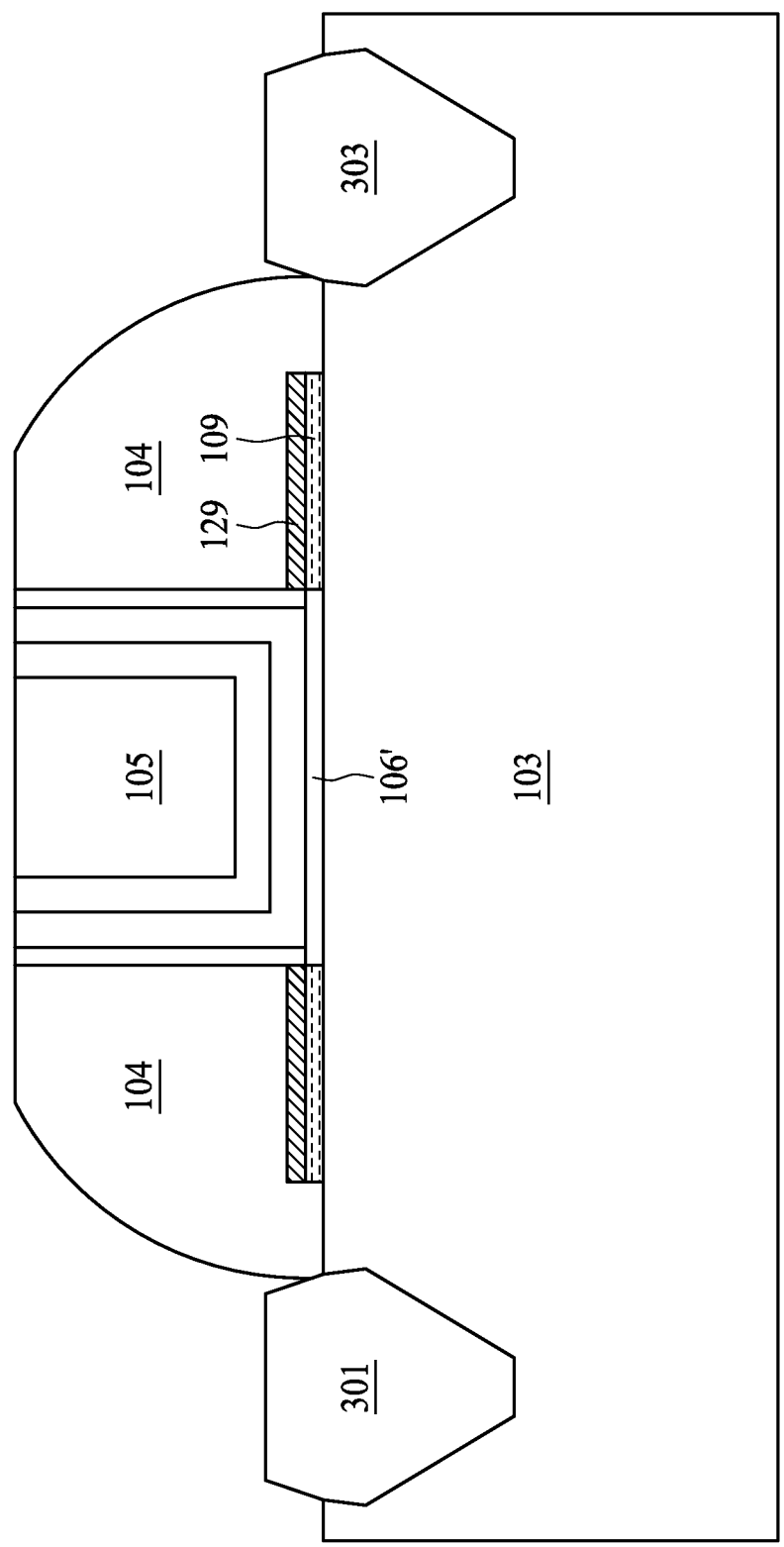

Referring to FIG. 29, a metal gate 105 is formed by multi-layer deposition to fill the trench resulting from the removal of the replacement gate 105'. In some embodiments, a high-k dielectric layer 106' is formed before the deposition of the metal gate 105. Top surface of the metal gate further undergoes planarization operation.

Some embodiments of the present disclosure provide a FinFET structure, including a plurality of fins, a gate, and a first dopant layer. The gate is disposed substantially orthogonal over the plurality of fins, covering a portion of a top surface and a portion of sidewalls of the plurality of fins. The first dopant layer covers the top surface and the sidewalls of a junction portion of a first fin, configured to provide dopants of a first conductive type to the junction portion of the first fin. The junction portion is adjacent to the gate.

In some embodiments, the FinFET structure further includes a sidewall spacer covering the first dopant layer over the junction portion.

In some embodiments, the FinFET structure further includes a second dopant layer covering a top surface and sidewalls of the junction portion of a second fin, configured to provide dopants of a second conductive type to the junction portion of the second fin.

In some embodiments, the FinFET structure further includes a bi-layer covering a top surface and sidewalls of the junction portion of a second fin. The bi-layer includes a first dopant layer and a diffusion barrier layer.

In some embodiments, the first dopant layer includes borosilicate glass (BSG), phosphosilicate glass (PSG), borophosphosilicate glasses (BPSG), or the combinations thereof.

In some embodiments, a first dopant concentration in the first fin is uniformly distributed in proximity to the top surface and the sidewalls of the first fin.

In some embodiments, a thickness of the first dopant layer is in a range of from about 2 nm to about 8 nm.

Some embodiments of the present disclosure provides a MOS structure, including a first semiconductor fin and a metal gate covering a channel of the MOS structure. The first semiconductor fin includes a regrown region and a lightly doped region. The lightly doped region is between the regrown region and the metal gate. A first dopant concentration in proximity to a top surface of the lightly doped region is substantially the same as the first dopant concentration in proximity to a bottom sidewall of the lightly doped region.

In some embodiments, a difference between the first dopant concentration in proximity to the top surface of the lightly doped region and the first dopant concentration in proximity to the sidewall of the lightly doped region is below about 5%.

In some embodiments, the top surface and the sidewall of the lightly doped region are covered by a first dopant layer configured to provide the lightly doped region with dopants of a first conductive type.

In some embodiments, the dopant layer includes BSG, PSG, BPSG, or the combinations thereof.

In some embodiments, a thickness of the first dopant layer is in a range of from about 1 nm to about 8 nm.

In some embodiments, the MOS structure further includes a second semiconductor fin having a lightly doped region between a regrown region and the metal gate. A second dopant concentration in proximity to a top surface of the lightly doped region is substantially the same as the second dopant concentration in proximity to a bottom sidewall of the lightly doped region.

In some embodiments, a difference between the second dopant concentration in proximity to the top surface of the lightly doped region and the second dopant concentration in proximity to the sidewall of the lightly doped region is below about 5%.

Some embodiments of the present disclosure provides a method for manufacturing a FinFET structure, including (1) forming a plurality of semiconductor fins; (2) forming a diffusion barrier over a top surface and a sidewall of a first set of a plurality of semiconductor fins; (3) forming a first dopant layer over a top surface and a sidewall of a second set of the plurality of semiconductor fins, the first dopant layer including dopants of a first conductive type; (4) diffusing the dopants of the first conductive type into the second set of the plurality of semiconductor fins by an annealing operation. The dopant concentration of the dopants of the first conductive type in proximity to the top surface is controlled to be substantially identical to the dopant concentration of the dopants of the first conductive type in proximity to a bottom sidewall of the second set of the plurality of the semiconductor fins.

In some embodiments, the forming the first dopant layer includes forming doped oxide layer having a thickness in a range of from about 3 nm to about 5 nm by an atomic layer deposition (ALD) operation.

In some embodiments, the forming the capping layer includes forming a nitride layer having a thickness in a range of from about 8 nm to about 12 nm by an ALD operation.

In some embodiments, the annealing operation includes duration of from about 1.5 second to about 10 seconds at a temperature range of from about 950 degrees Celsius to about 1050 degrees Celsius.

In some embodiments, the method further includes removing the diffusion barrier layer from the first set of the plurality of the semiconductor fins by an etching operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A FinFET structure, comprising:
a plurality of fins;
a gate, disposed substantially orthogonal over the plurality of fins, covering a portion of a top surface and a portion of sidewalls of the plurality of fins;
a first dopant layer, covering the top surface and the sidewalls of a junction portion of a first fin, configured to provide dopants of a first conductive type to the junction portion of the first fin, wherein the junction portion is adjacent to the gate, and
a sidewall spacer, covering the first dopant layer over the junction portion.

2. The FinFET structure of claim 1, further comprising a second dopant layer, covering a top surface and sidewalls of the junction portion of a second fin, configured to provide dopants of a second conductive type to the junction portion of the second fin.

3. The FinFET structure of claim 1, further comprising a bi-layer, covering a top surface and sidewalls of the junction portion of a second fin, wherein the bi-layer comprises a first dopant layer and a diffusion barrier layer.

4. The FinFET structure of claim 1, wherein the first dopant layer comprises borosilicate glass (BSG), phosphosilicate glass (PSG), borophosphosilicate glasses (BPSG), or the combinations thereof.

5. The FinFET structure of claim 1, wherein a first dopant concentration in the first fin is uniformly distributed in proximity to the top surface and the sidewalls of the first fin.

6. The FinFET structure of claim 1, wherein a thickness of the first dopant layer is in a range of from about 1 nm to about 8 nm.

7. The FinFET structure of claim 5, wherein a difference between the first dopant concentration in proximity to the top surface of the junction portion and the first dopant concentration in proximity to the sidewall of the junction portion is below about 5%.

8. A MOS structure, comprising:
a first semiconductor fin; and
a metal gate covering a channel of the MOS structure,
wherein the first semiconductor fin comprises:
  a regrown region; and
  a lightly doped region between the regrown region and the metal gate,
  wherein a first dopant concentration in proximity to a top surface of the lightly doped region is substantially the same as the first dopant concentration in proximity to a bottom sidewall of the lightly doped region.

9. The MOS structure of claim 8, wherein a difference between the first dopant concentration in proximity to the top surface of the lightly doped region and the first dopant concentration in proximity to the sidewall of the lightly doped region is below about 5%.

10. The MOS structure of claim 8, wherein the top surface and the sidewall of the lightly doped region are covered by a first dopant layer configured to provide the lightly doped region with dopants of a first conductive type.

11. The MOS structure of claim 10, wherein the dopant layer comprises BSG, PSG, BPSG, or the combinations thereof.

12. The MOS structure of claim 10, wherein a thickness of the first dopant layer is in a range of from about 1 nm to about 8 nm.

13. The MOS structure of claim 8, further comprising a second semiconductor fin having a lightly doped region between a regrown region and the metal gate, wherein a second dopant concentration in proximity to a top surface of the lightly doped region is substantially the same as the second dopant concentration in proximity to a bottom sidewall of the lightly doped region.

14. The MOS structure of claim 13, wherein a difference between the second dopant concentration in proximity to the top surface of the lightly doped region and the second dopant concentration in proximity to the sidewall of the lightly doped region is below about 5%.

15. A non-planar FET structure, comprising
a semiconductor fin;
a gate over the semiconductor fin;
a source at least partially in the semiconductor fin and disposed at one sides of the gate;
a sidewall spacer over the semiconductor fin, spacing the gate and the source; and
a dopant layer on a top surface of the semiconductor fin, laterally abutting the gate and being encapsulated by the sidewall spacer.

16. The non-planar FET structure of claim 15, wherein the gate is a metal gate.

17. The non-planar FET structure of claim 15, wherein the dopant layer comprises borosilicate glass (BSG), phosphosilicate glass (PSG), borophosphosilicate glasses (BPSG), or the combinations thereof.

18. The non-planar FET structure of claim 15, wherein the sidewall spacer is composed of nitride materials.

19. The non-planar FET structure of claim 15, further comprising a capping layer over the dopant layer, the capping layer being encapsulated by the sidewall spacer.

20. The non-planar FET structure of claim 15, wherein the dopant layer is not in contact with the source.

* * * * *